United States Patent
Hsiung et al.

(10) Patent No.: US 12,119,386 B2
(45) Date of Patent: Oct. 15, 2024

(54) CONDUCTIVE CAPPING FOR WORK FUNCTION LAYER AND METHOD FORMING SAME

(71) Applicant: Taiwan Semiconductor Manufacturing Co., Ltd., Hsinchu (TW)

(72) Inventors: Te-Chih Hsiung, Taipei (TW); Jyun-De Wu, New Taipei (TW); Yi-Chen Wang, Zhubei (TW); Yi-Chun Chang, Hsinchu (TW); Yuan-Tien Tu, Puzih (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 168 days.

(21) Appl. No.: 17/340,818

(22) Filed: Jun. 7, 2021

(65) Prior Publication Data
US 2022/0310814 A1 Sep. 29, 2022

Related U.S. Application Data

(60) Provisional application No. 63/166,311, filed on Mar. 26, 2021.

(51) Int. Cl.
*H01L 29/423* (2006.01)
*H01L 29/40* (2006.01)
(Continued)

(52) U.S. Cl.
CPC ........ *H01L 29/4238* (2013.01); *H01L 29/401* (2013.01); *H01L 29/515* (2013.01); *H01L 29/66545* (2013.01)

(58) Field of Classification Search
CPC . H01L 29/4238; H01L 29/401; H01L 29/515; H01L 29/66545
See application file for complete search history.

(56) References Cited

U.S. PATENT DOCUMENTS

| 8,487,378 B2 | 7/2013 | Goto et al. |
| 8,729,634 B2 | 5/2014 | Shen et al. |
| (Continued) | | |

FOREIGN PATENT DOCUMENTS

| KR | 20180082297 A | 7/2018 |
| KR | 20190124417 A | 11/2019 |
| (Continued) | | |

*Primary Examiner* — Monica D Harrison
*Assistant Examiner* — Andre C Stevenson
(74) *Attorney, Agent, or Firm* — Slater Matsil, LLP

(57) ABSTRACT

A method includes removing a dummy gate stack to form a first trench between gate spacers, forming a replacement gate stack in the first trench, recessing the replacement gate stack to form a second trench between the gate spacers, selectively depositing a conductive capping layer in the second trench, forming a dielectric hard mask in the second trench and over the conductive capping layer, and etching the dielectric hard mask using an etching gas to form an opening in the dielectric hard mask. The replacement gate stack is revealed to the opening. The conductive capping layer is more resistant to the etching gas than the replacement gate stack. The method further comprises forming a gate contact plug over and contacting the conductive capping layer.

20 Claims, 24 Drawing Sheets

(51) Int. Cl.
*H01L 29/51* (2006.01)
*H01L 29/66* (2006.01)

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 10,516,030 B2 | 12/2019 | Pan et al. |
| 11,302,818 B2 | 4/2022 | Wu et al. |
| 11,309,393 B2 | 4/2022 | Lee et al. |
| 11,417,652 B2 | 8/2022 | Lee et al. |
| 2014/0282326 A1 | 9/2014 | Chen et al. |
| 2017/0040318 A1* | 2/2017 | Hung ............ H01L 27/0886 |
| 2017/0077256 A1 | 3/2017 | Adusumilli et al. |
| 2019/0333915 A1* | 10/2019 | Lee ............ H01L 29/7851 |
| 2020/0027842 A1* | 1/2020 | Lee ............ H01L 23/544 |
| 2020/0035796 A1* | 1/2020 | Lee ............ H01L 21/76834 |
| 2020/0287015 A1* | 9/2020 | Subramanian ........ H01L 23/535 |
| 2020/0411639 A1* | 12/2020 | Mannebach ........ H01L 29/0649 |
| 2021/0066466 A1* | 3/2021 | Kwon ............ H01L 29/4238 |
| 2021/0082756 A1 | 3/2021 | Tsai et al. |
| 2022/0069101 A1* | 3/2022 | Choi ............ H01L 29/66439 |
| 2022/0190160 A1* | 6/2022 | Tang ............ H01L 29/0657 |

FOREIGN PATENT DOCUMENTS

| | | |
|---|---|---|
| KR | 20200012242 A | 2/2020 |
| KR | 20210032874 A | 3/2021 |

* cited by examiner

CONDUCTIVE CAPPING FOR WORK FUNCTION LAYER AND METHOD FORMING SAME

PRIORITY CLAIM AND CROSS-REFERENCE

This application claims the benefit of the following provisionally filed U.S. Patent application: Application No. 63/166,311, filed on Mar. 26, 2021, and entitled "Novel MG work Function Metal Capping Method and Geometry Formation for Interface Low Resistant," which application is hereby incorporated herein by reference.

BACKGROUND

To achieve faster speed, lower power assumption, and higher degree of integration, transistors are made to be increasingly smaller. For example, the metal gates of transistors are made increasingly narrower. The contact areas between the metal gates and the overlying gate contact plugs also become smaller, resulting in higher contact resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
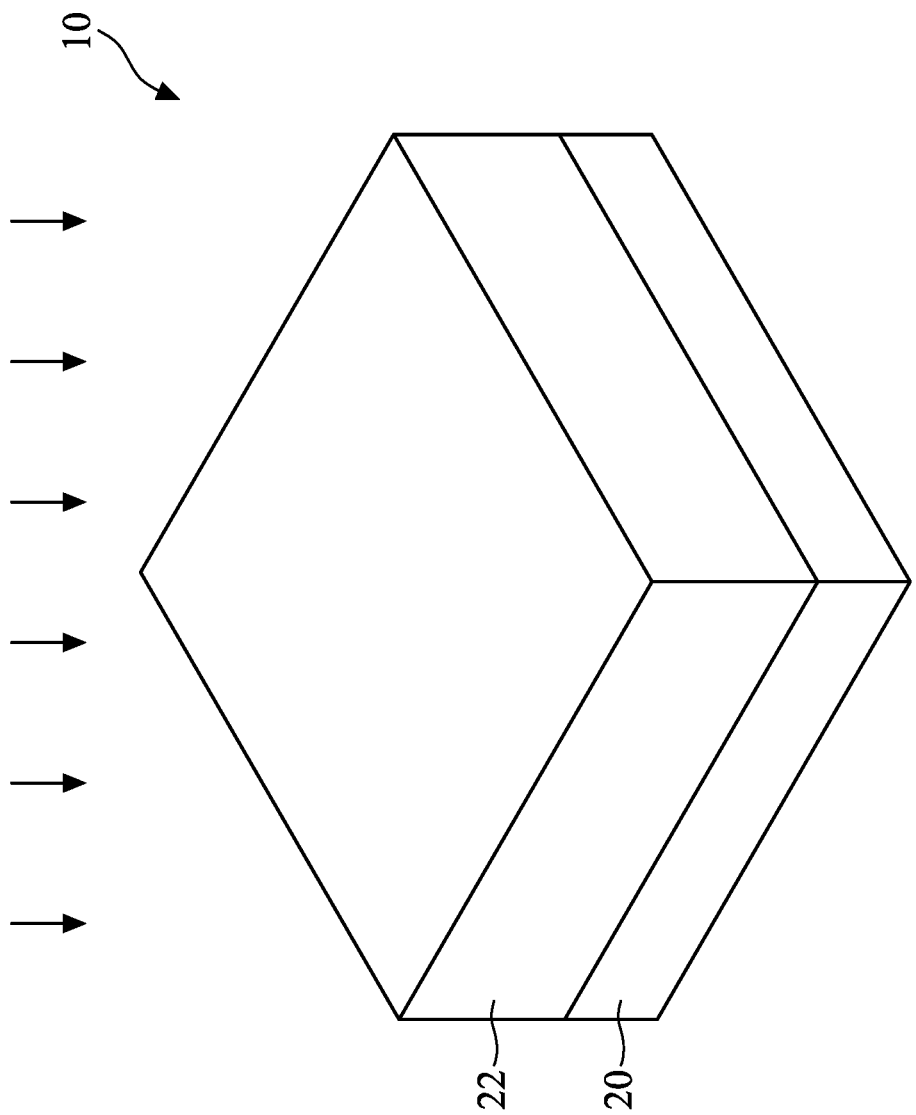
FIGS. 1-6, 7A, 7B, 8, 9A, 9B, 10-11, 12A, 12B, 13A, 13B, and 14A illustrate the perspective views and cross-sectional views of intermediate stages in the formation of transistors having conductive capping layers on metal gates in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor having metal gates and conductive capping layers and the method of forming the same are provided. In accordance with some embodiments of the present disclosure, a replacement gate stack of a transistor is formed. The replacement gate stack is recessed, and a conductive capping layer is formed on the replacement gate stack. The conductive capping layer may have a conductivity value higher than at least some layers (such as work function layers) in the gate stack. Low contact resistance is achieved for electrically connecting the gate electrode in the gate stack to an overlying gate contact plug. Although a Fin Field-Effect Transistor (FinFET) is used as an example, other types of transistors such as planar transistors and nanostructure transistor (such as Gate-All-Around (GAA) transistors, nanowire transistors, nanosheet transistors, etc.) are all in the scope of the present disclosure. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-6, 7A, 7B, 8, 9A, 9B, 10-11, 12A, 12B, 13A, 13B, and 14A illustrate the perspective views and cross-sectional views of intermediate stages in the formation of a transistor having conductive capping layers on metal gates in accordance with some embodiments. The corresponding processes are also reflected schematically in the process flow shown in FIG. 16.

Referring to FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, SiP, GaAsP, AlInAs, AlGaAs, GaInAs, GaInP, and/or GaInAsP; or combinations thereof.

Figure 16:
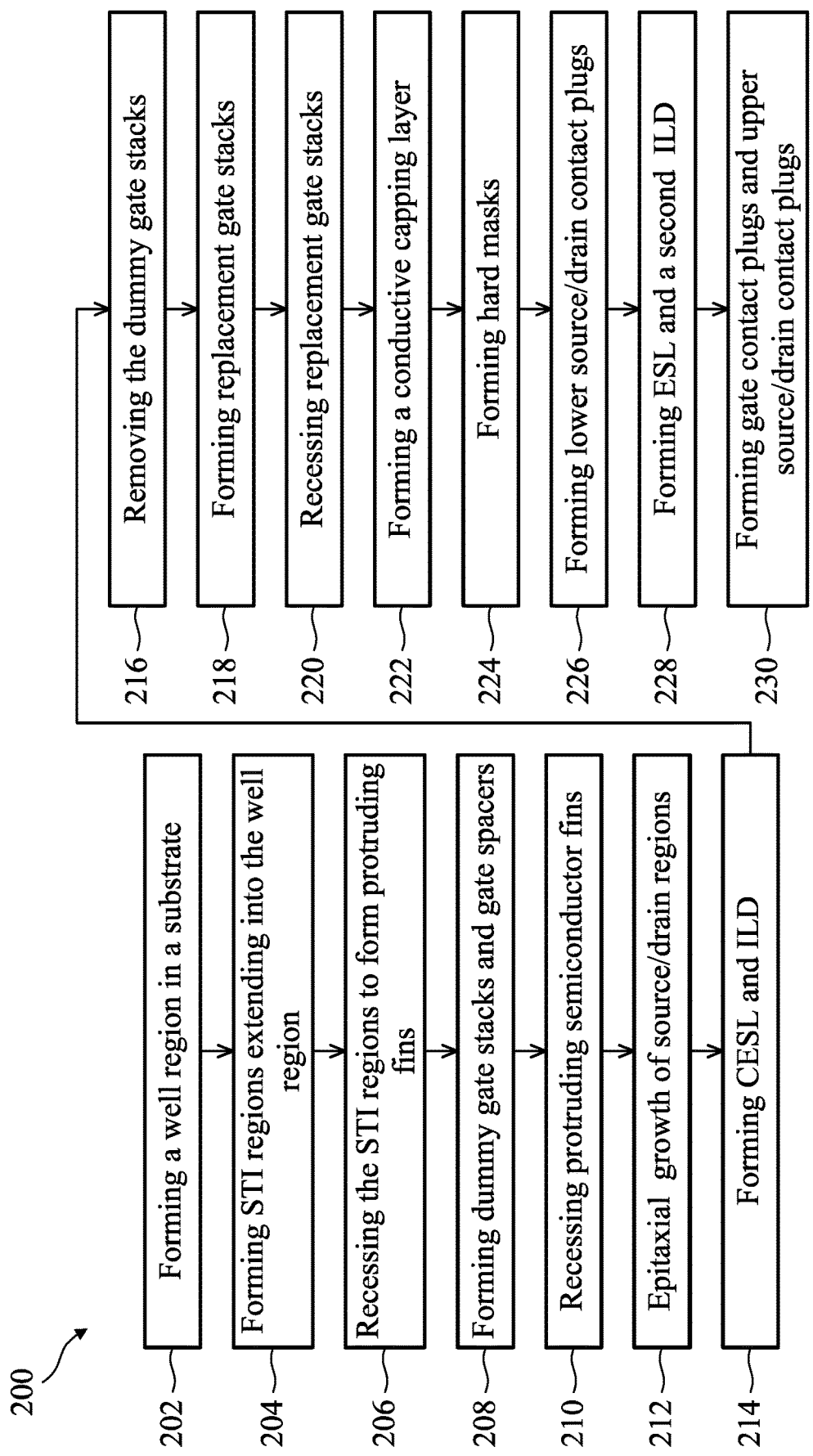
FIG. 16 illustrates a process flow for forming a transistor having conductive capping layers on metal gates in accordance with some embodiments.

Further referring to FIG. 1, well region 22 is formed in substrate 20. The respective process is illustrated as process 202 in the process flow 200 as shown in FIG. 16. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
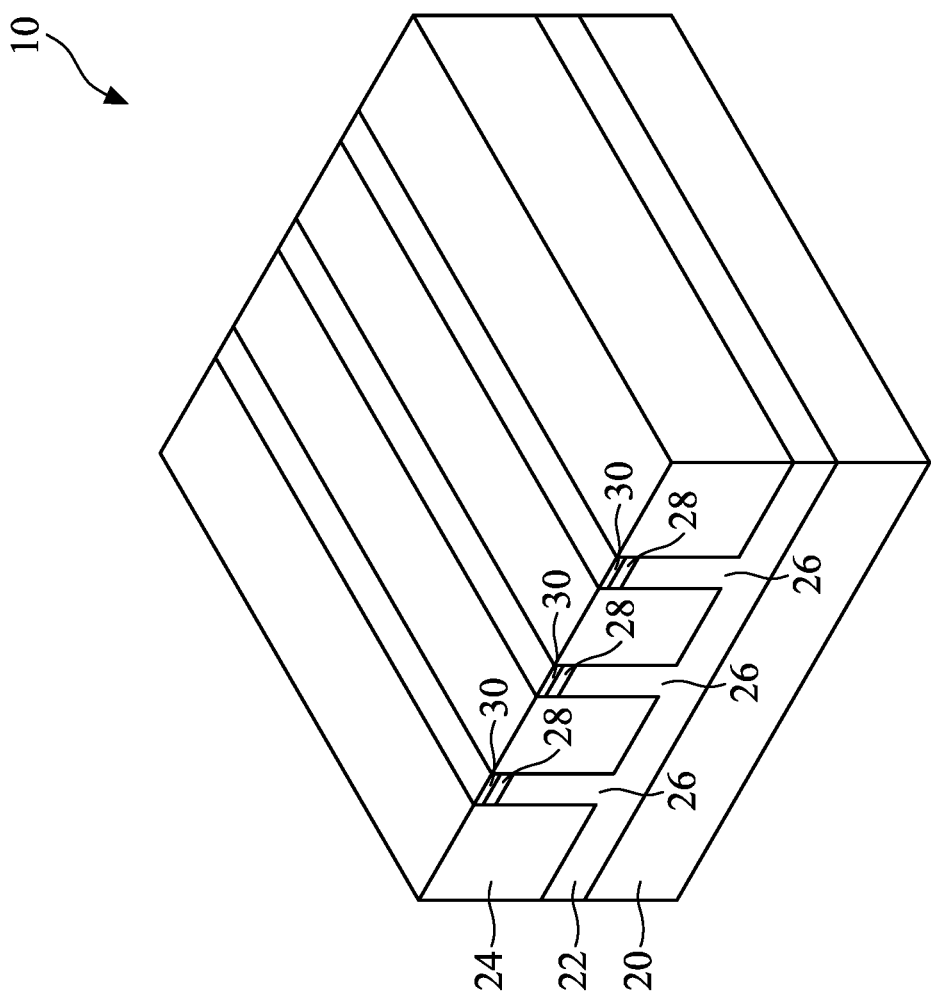

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 as shown in FIG. 16. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, deposited using Low-Pressure Chemical Vapor Deposition (LPCVD), Atomic Layer Deposition (ALD), Plasma Enhanced Chemical Vapor Deposition (PECVD), High-Density Plasma Chemical Vapor Deposition (HDPCVD), or the like. A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), Low-Pressure Chemical Vapor Deposition (LPCVD), Plasma Enhanced Chemical Vapor Deposition (PECVD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
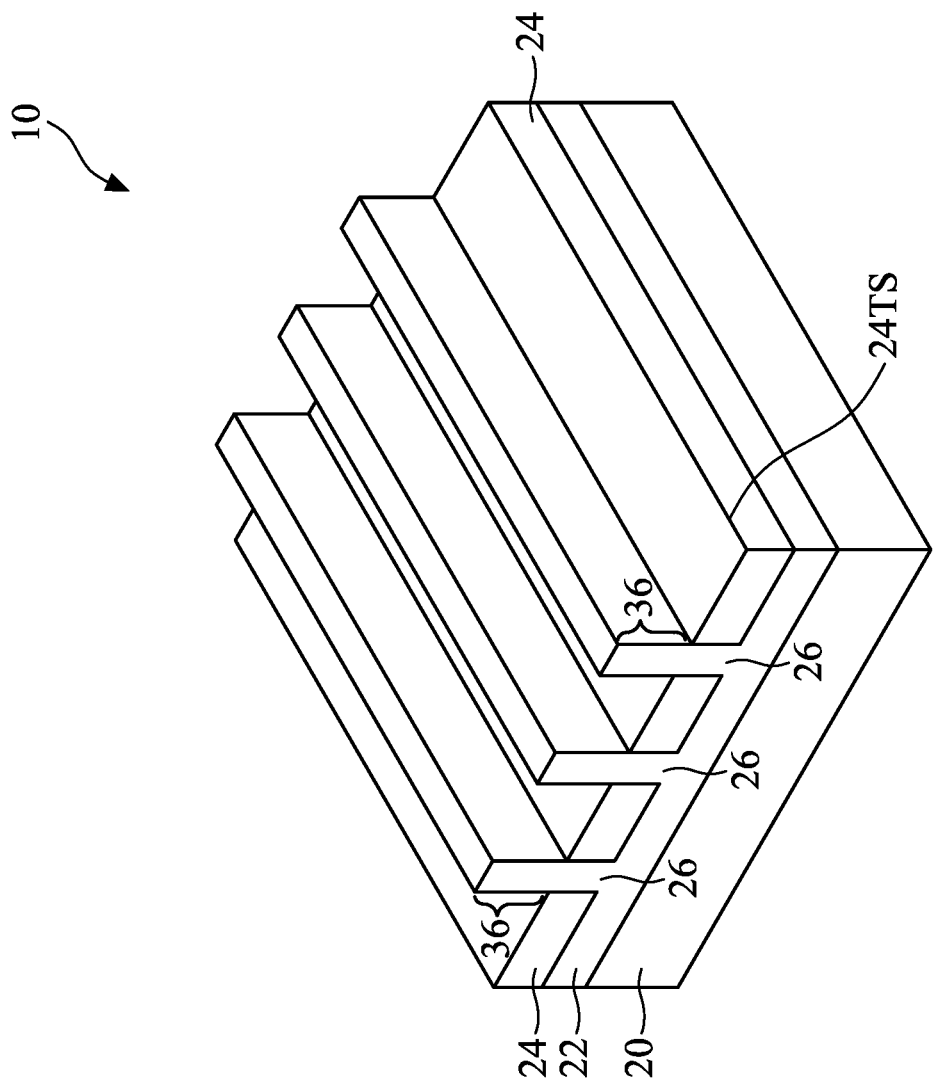

Referring to FIG. 3, STI regions 24 are recessed to have top surfaces 24TS and bottom surfaces 24BS, so that the top portions of semiconductor strips 26 protrude higher than the top surfaces 24TS of the remaining portions of STI regions 24 to form protruding fins 36. The respective process is illustrated as process 206 in the process flow 200 as shown in FIG. 16. The etching may be performed using a dry etching process, wherein HF, $NH_3$, $C_xH_yF_z$ (with X=1~6, y=0~9, and z=0~12), $NF_3$, HBr, CO, $CO_2$, COS, $SO_2$, $SF_6$, $BCl_3$, $Cl_2$, $CF_4$, $CH_4$, $CHF_3$, $TiCl_x$, $TaCl_x$, $WCl_x$, or the like, are used as the etching gases. During the etching process, plasma may be generated. Argon, $O_2$, $N_2$, $H_2$ may also be included. In accordance with alternative embodiments of the present disclosure, the recessing of STI regions 24 is performed using a wet etching process. The etching chemical may include diluted HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
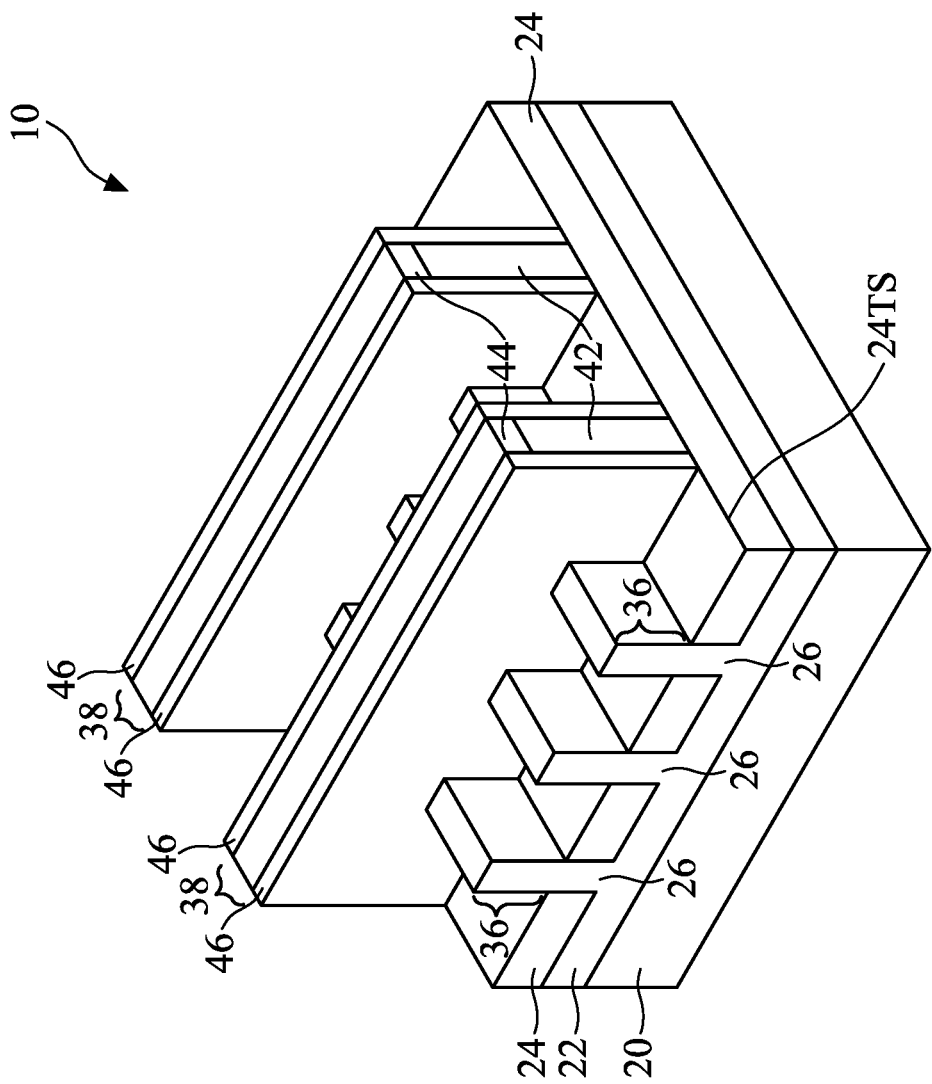

Referring to FIG. 4, dummy gate stacks 38 are formed to extend on the top surfaces and the sidewalls of (protruding) fins 36. The respective process is illustrated as process 208 in the process flow 200 as shown in FIG. 16. Dummy gate stacks 38 may include dummy gate dielectrics 40 (FIG. 7B) and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 as shown in FIG. 16. In accordance with some embodiments of the present disclosure, gate spacers 46 are formed of a dielectric material(s) such as silicon nitride, silicon carbo-nitride, silicon oxy-carbo-nitride, or the like, and may have a single-layer structure or a multi-layer structure including a plurality of dielectric layers.

Figure 5:
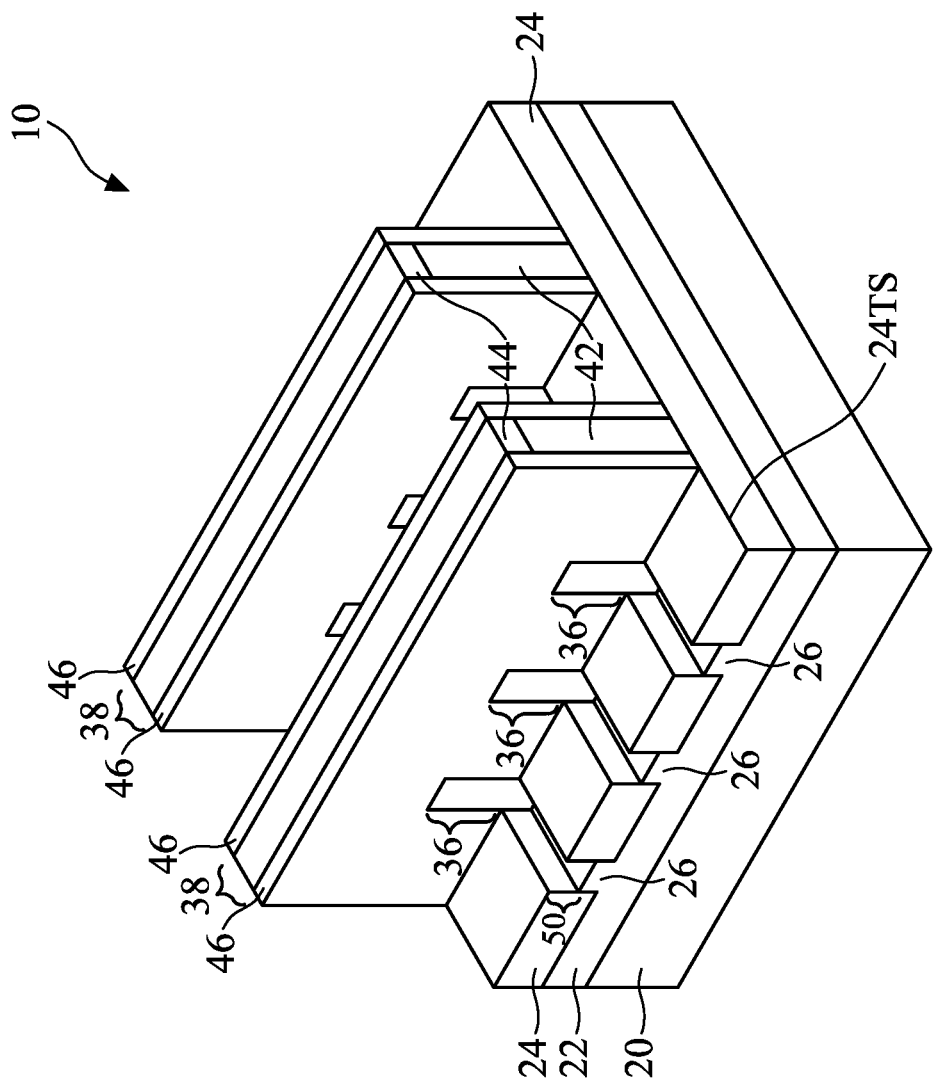

An etching process is then performed to etch the portions of protruding fins 36 that are not covered by dummy gate stacks 38 and gate spacers 46, resulting in the structure shown in FIG. 5. The respective process is illustrated as process 210 in the process flow 200 as shown in FIG. 16. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24TS of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
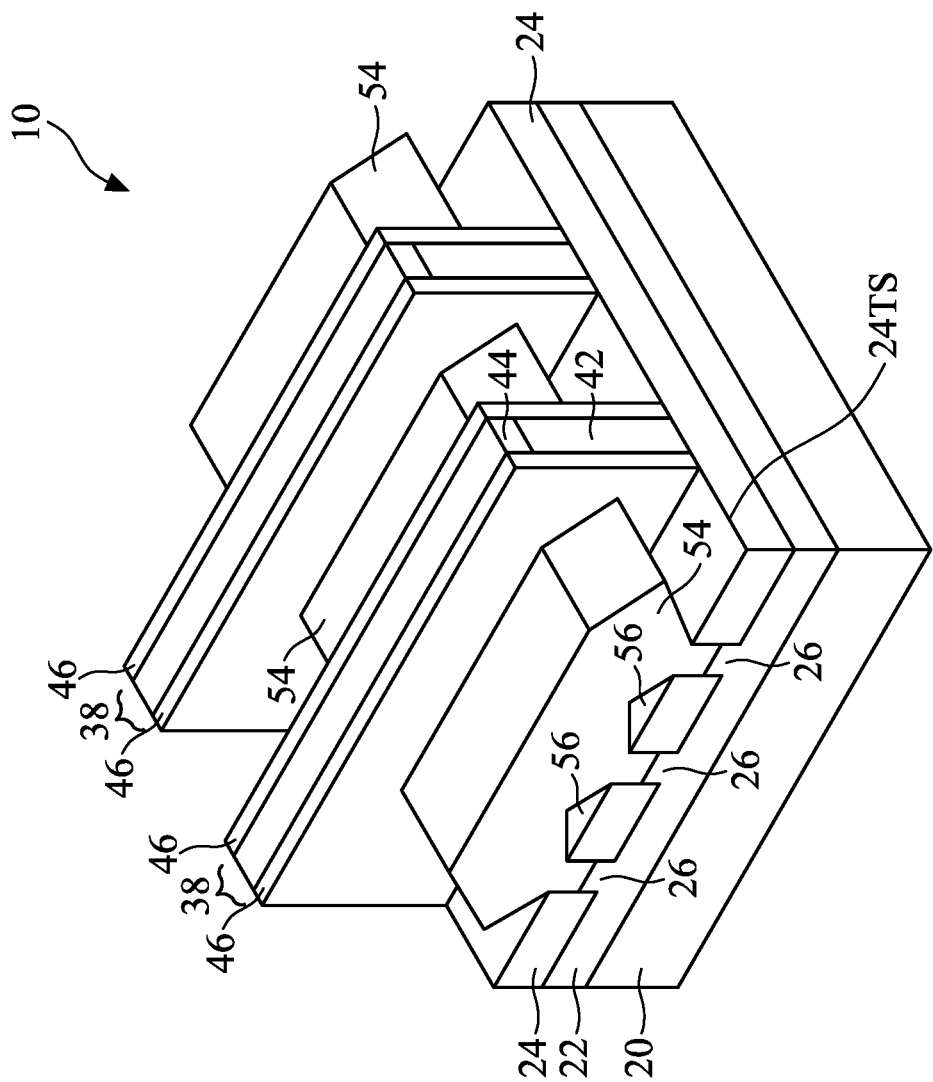

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 as shown in FIG. 16. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
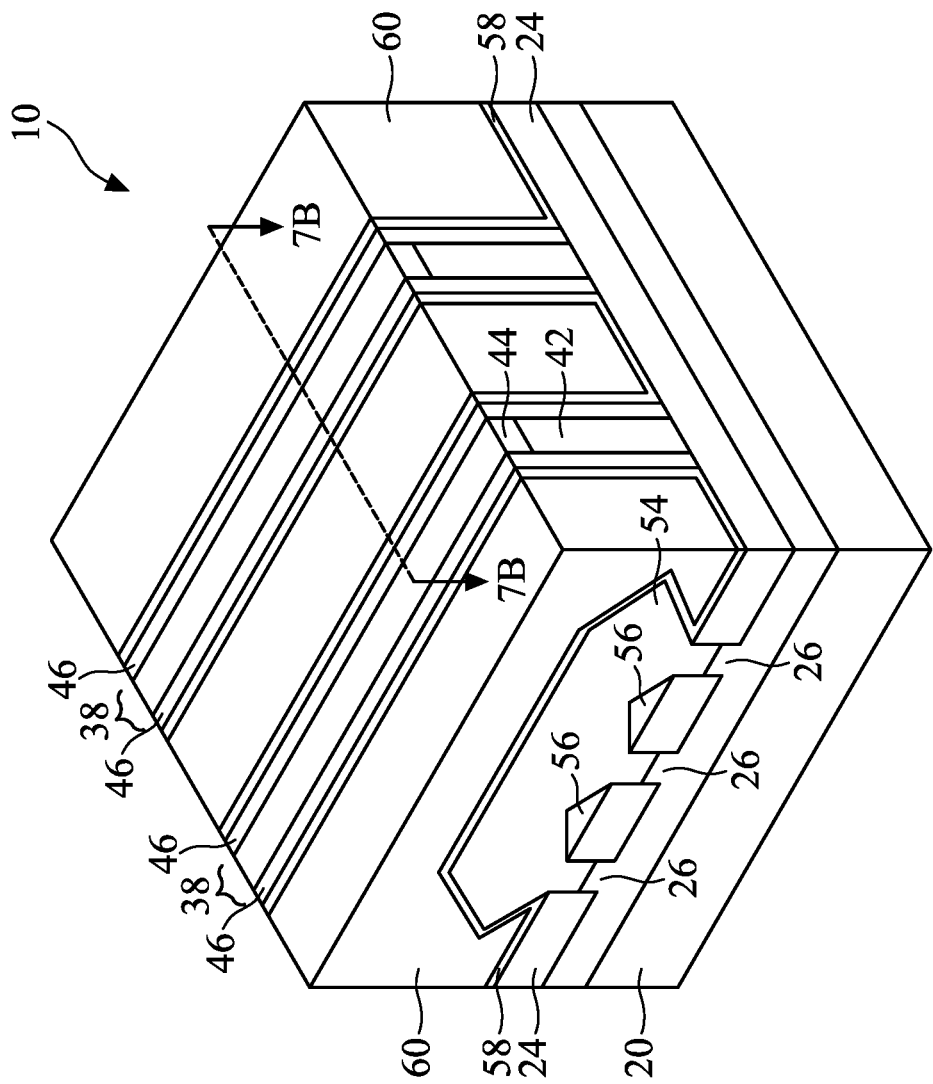

FIG. 7A illustrates a perspective view of the structure after the formation of Contact Etch Stop Layer (CESL) 58 and Inter-Layer Dielectric (ILD) 60. The respective process is illustrated as process 214 in the process flow 200 as shown in FIG. 16. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
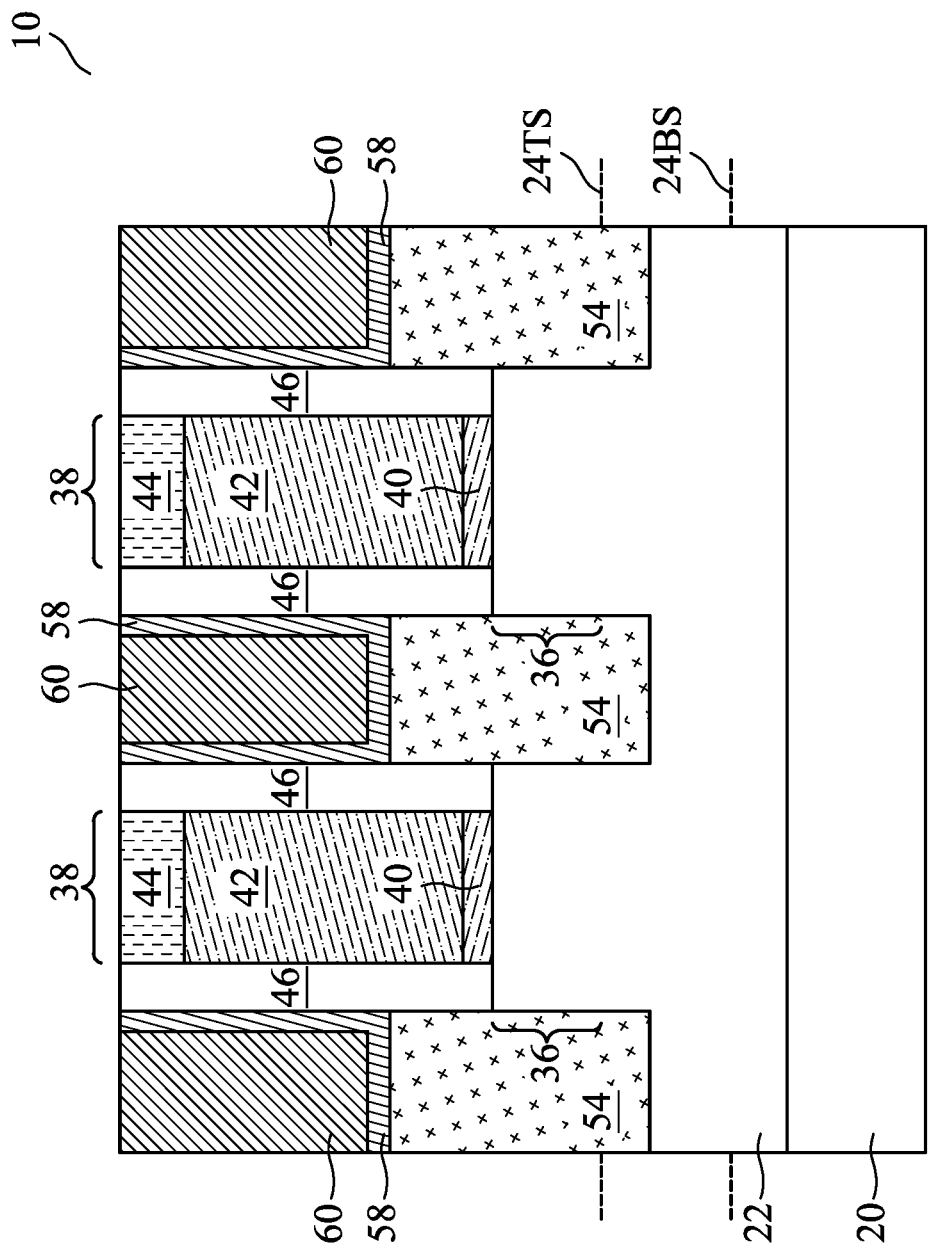
Figure 8:
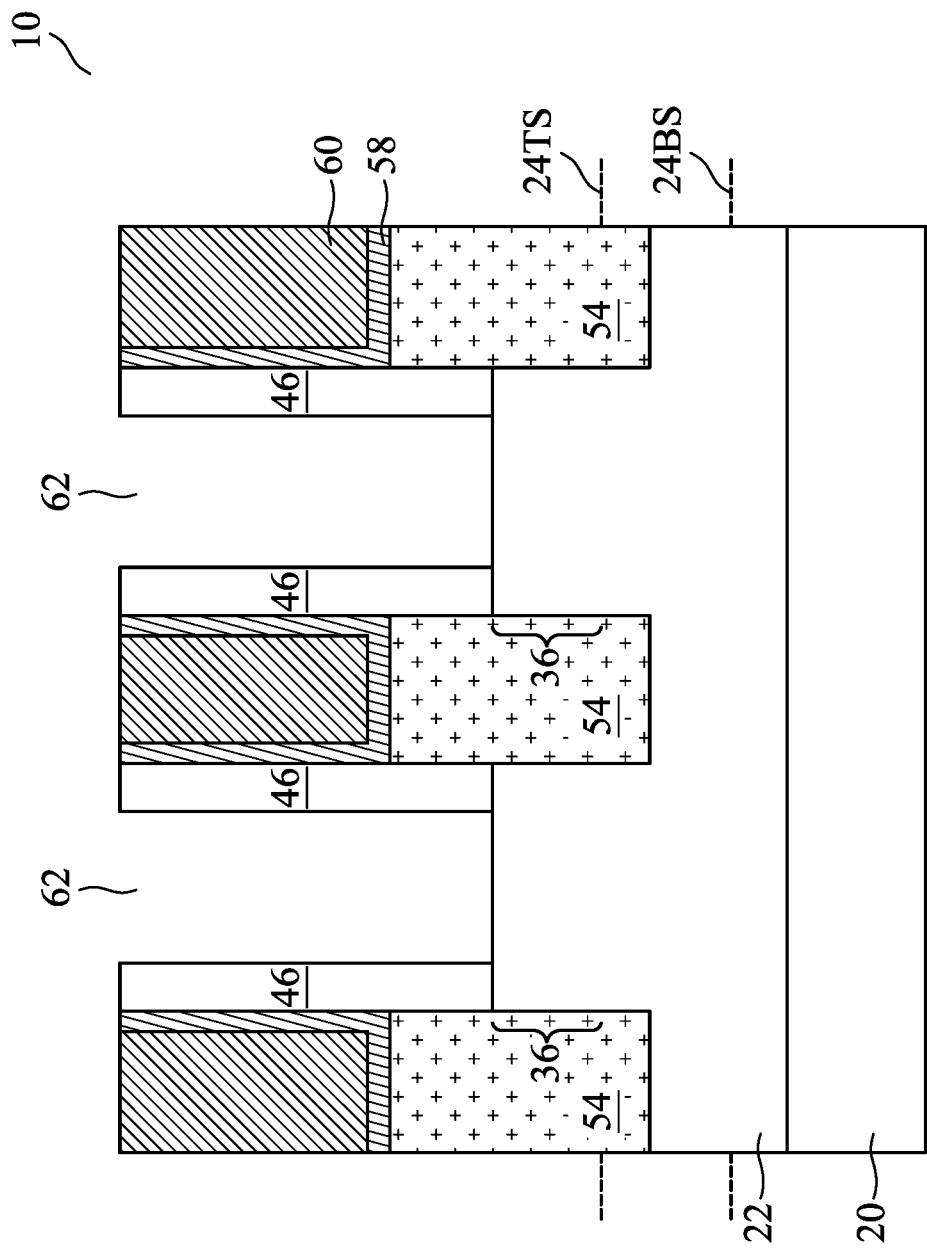

FIG. 7B illustrates the reference cross-section 7B-7B in FIG. 7A, in which dummy gate stacks 38 are illustrated. Next, the dummy gate stacks 38 including hard mask layers 44, dummy gate electrodes 42 and dummy gate dielectrics 40 are etched, forming trenches 62 between gate spacers 46, as shown in FIG. 8. The respective process is illustrated as process 216 in the process flow 200 as shown in FIG. 16. The top surfaces and the sidewalls of protruding fins 36 are exposed to trenches 62.

Figure 9A:
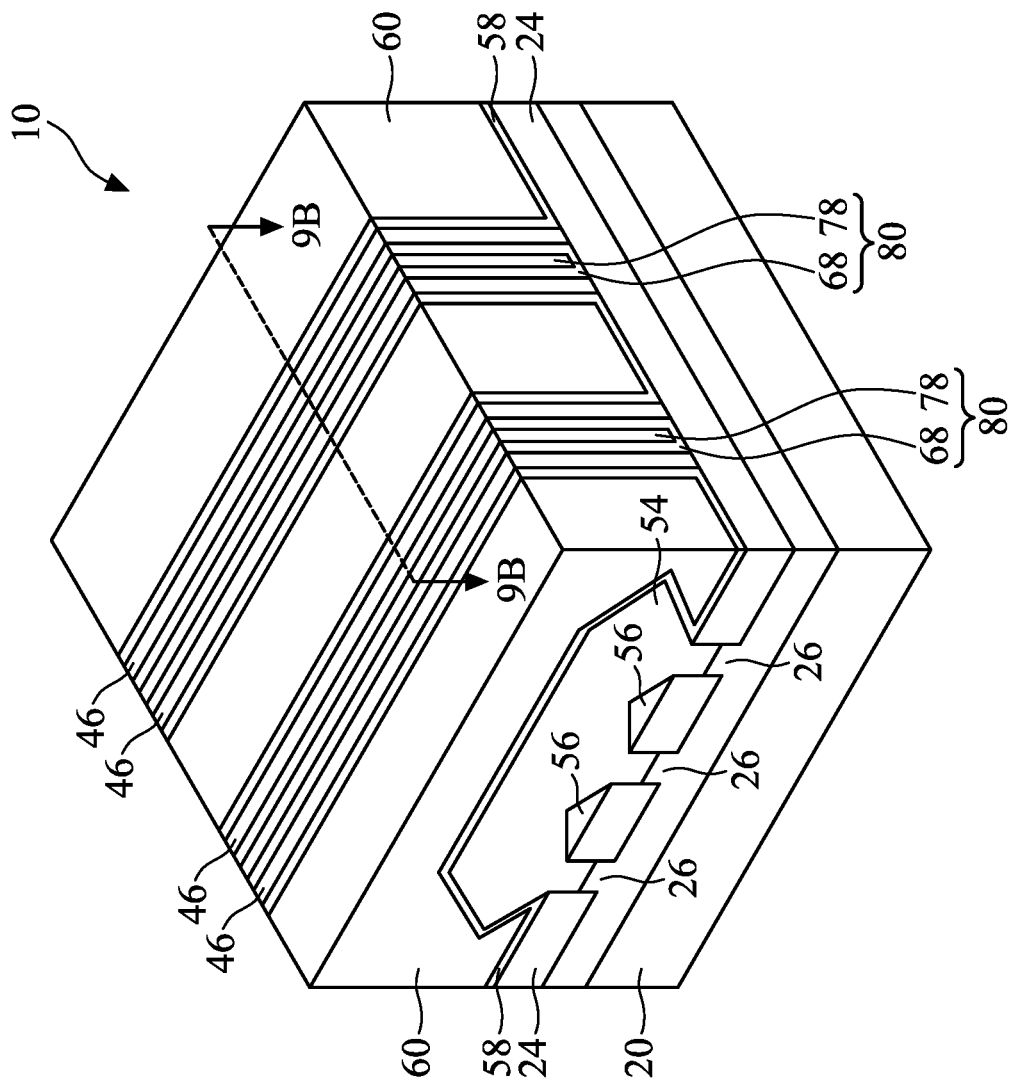
Figure 9B:
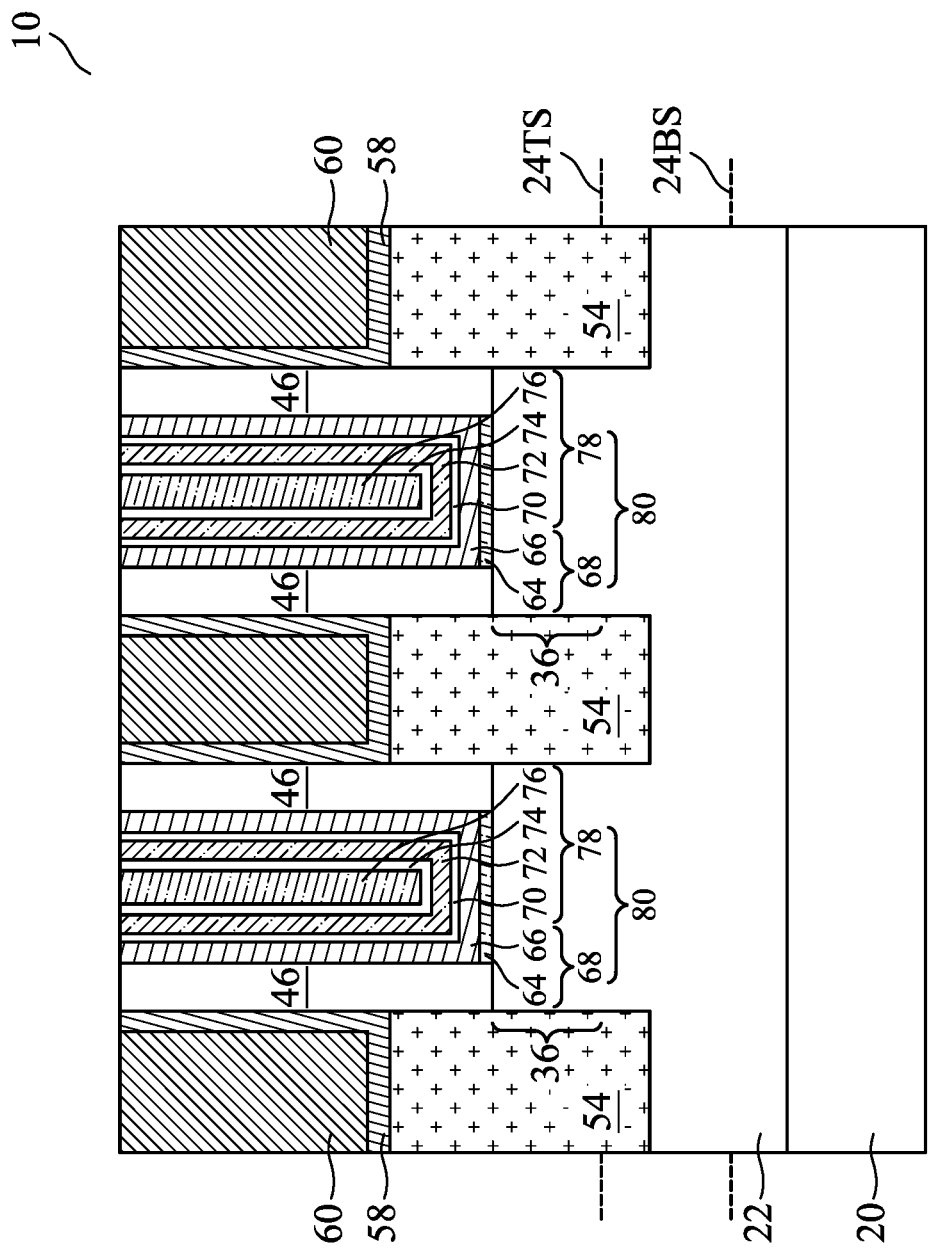

Next, as shown in FIGS. 9A and 9B, replacement gate stacks 80 are formed in trenches 62 (FIG. 8). The respective process is illustrated as process 218 in the process flow 200 as shown in FIG. 16. Replacement gate stacks 80 include gate dielectrics 68 and the corresponding gate electrodes 78.

FIG. 9B illustrates the reference cross-section 9B-9B in FIG. 9A. In accordance with some embodiments of the present disclosure, a gate dielectric 68 includes Interfacial Layer (IL) 64 as its lower part, as shown in FIG. 9B. IL 64 is formed on the exposed surfaces of protruding fins 36. IL 64 may include an oxide layer such as a silicon oxide layer or a silicon germanium oxide layer, which is formed through the thermal oxidation of protruding fins 36, a chemical oxidation process, or a deposition process. Gate dielectric 68 may also include high-k dielectric layer 66 deposited over IL 64. High-k dielectric layer 66 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0 or higher. High-k dielectric layer 66 is overlying, and may contact, IL 64. High-k dielectric layer 66 is formed as a conformal layer, and extends on the sidewalls of protruding fins 36 and the top surface and the sidewalls of gate spacers 46. In accordance with some embodiments of the present disclosure, high-k dielectric layer 66 is formed using ALD, CVD, PECVD, LPCVD, HDPCVD, FCVD, Molecular-Beam Deposition (MBD), or the like.

Further referring to FIG. 9B, gate electrodes 78 are formed on gate dielectrics 68. Gate electrodes 78 may include a plurality of stacked layers 70, 72, and 74, which may be formed as conformal layers, and filling-metal regions 76 filling the rest of the trenches unfilled by the plurality of stacked layers 70, 72, and 74. Each of plurality of stacked layers 70, 72, and 74 may have the shape of a basin including a bottom and sidewall portions forming a ring and joined to the bottom (as shown in the cross-section of FIG. 9B). A brief formation process of gate stacks 80 is discussed below. It is appreciated that the discussed layers are examples, and different layer schemes may be adopted.

In accordance some embodiments, adhesion layer (which is also a diffusion barrier layer) 70 is formed over high-k dielectric layer 66. Adhesion layer 70 may be formed of or comprise Ti, TiN or Titanium Silicon Nitride (TiSiN). The TiN layer may be formed using ALD or CVD, and the TiSiN layer may include alternatingly deposited TiN layers and SiN layers, which are formed using ALD, for example. Since the TiN layers and SiN layers are very thin, these layers may not be able to be distinguished from each other, and are hence referred to as a TiSiN layer.

Work function layer 72 is formed over adhesion layer 70. Work function layer 72 determines the work function of the gate, and includes at least one layer, or a plurality of layers formed of different materials. The material of the work function layer is selected according to whether the respective FinFET is an n-type FinFET or a p-type FinFET. For example, when the FinFET is an n-type FinFET, work function layer 72 may include TiC, TaC, TiAl, TiAlC, Ti, Al, Sc, Y, Er, La, Hf, alloys thereof, and/or multilayers thereof. When the FinFET is a p-type FinFET, work function layer 72 may include TiN, TaN, TiAlN, TiSiN, WCN, MOON, Pt, Pd, Ni, Au, alloys thereof, and/or multilayers thereof.

In accordance with some embodiments of the present disclosure, capping layer 74 is formed over work function layer 72, as shown in FIG. 9B. Capping layer 74 may be formed of TiN in accordance with some embodiments, and other materials such as TaN may be used. In accordance with some embodiments, capping layer 74 is formed using ALD, CVD, or the like.

Filling-metal region 76 is also formed over capping layer 74 if capping layer 74 has not fully filled the respective trench. In accordance with some embodiments, filling-metal region 76 is formed of tungsten, cobalt, aluminum, or the like or alloys thereof, which may be formed using CVD, FCVD, PECVD, HDPCVD, plating, or the like. In accordance with some embodiments in which metal region 76 comprises tungsten, $WF_6$, $WCl_5$, $WCl_6$, $SiH_4$, $H_2$, or the like, or the combinations thereof may be used as process gases for depositing tungsten. After the formation of filling-metal region 76, a planarization process may be performed to remove excess portions of the deposited layers including high-k dielectric layer 66, stacked layers 70, 72, and 74, and filling-metal regions 76. The remaining portions of the layers are gate stacks 80, as shown in FIGS. 9A and 9B.

Figure 10:
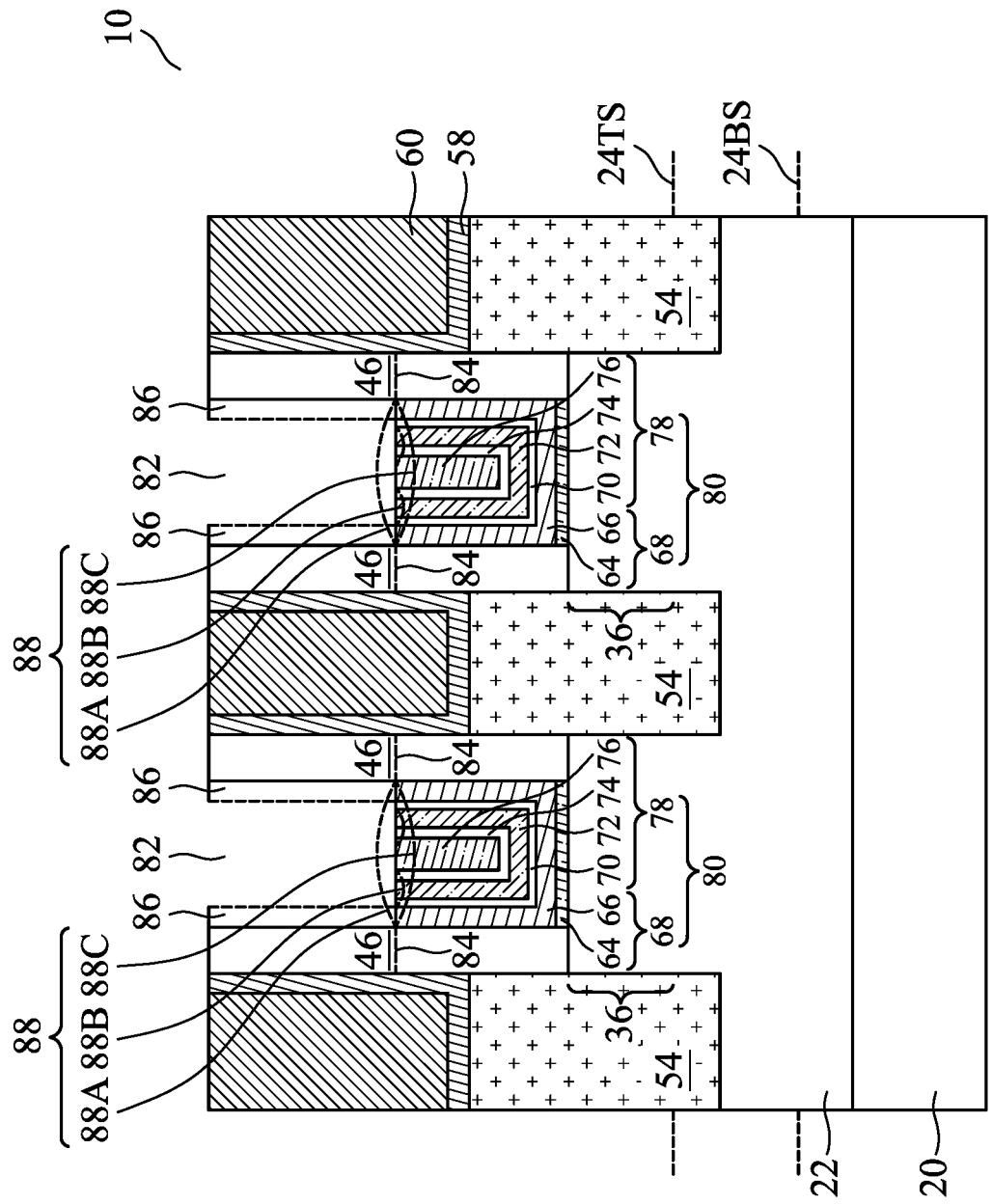

Referring to FIG. 10, gate stacks 80 are recessed, forming trenches 82. The respective process is illustrated as process 220 in the process flow 200 as shown in FIG. 16. The etching process may be a wet etching process, a dry etching process, or a wet etching process and a dry etching process. Depending on the structure and the materials of gate stack 80, when dry etching is used, the etching chemical may be selected from $BCl_3$, $Cl_2$, $CF_4$, $CH_4$, $CHF_3$, $C_xH_yF_z$ (with x=1~6, y=0~9, and z=0~12), $NF_3$, HBr, CO, $CO_2$, COS, $SO_2$, $SF_6$, $TiCl_x$, $TaCl_x$, $WCl_x$, $O_2$, Ar, or the like, or combinations thereof. When wet etching is used, the etching solution may include phosphoric acid, $NH_4OH$, a mixture of $NaHCO_3$/$H_2O_2$, a mixture of $NaHCO_3$/$NaOH$/$H_2O_2$, an alkali metal hydroxide aqueous solution, or the like. Also, depending on the desirable top surface profile, such as whether it is intended that gate stacks 80 have planar top surfaces, concave top surfaces, convex top surfaces, wavy top surfaces, or the like, different percentages of the etching gases (or wet etching chemicals) may be selected. Selecting different percentage of etching gases (or wet etching chemicals) may result in some layers to be specifically etched more or less than other layers, so that the top surface profile of gate stacks 80 are tuned to the desirable profile.

In accordance with some embodiments, as shown in FIG. 10, in the recessing, gate spacers 46 are not recessed. In accordance with alternative embodiments, in the recessing, gate spacers 46 are also recessed, and the top surfaces of the resulting gate spacers 46 are shown by dashed lines 84. When gate spacers 46 are also etched, the top surfaces of gate spacers 46 are lower than the top surfaces of ILD 60 and CESL 58. When recessed, gate spacers 46 may have top surfaces higher than, level with, or lower than the top surfaces of gate stacks 80. The adjusting of the top surface level of gate spacers 46 is also achieved by selecting the proper combination of etching chemicals.

In accordance with some embodiments, high-k dielectric layers 66 are etched during the recessing of gate stack 80. Recessing high-k dielectric layers 66 may result in wider trenches 82, and the subsequent gap-filling of trenches 82 are easier. In accordance with alternative embodiments, high-k dielectric layer 66 is not etched. The un-etched high-k dielectric layers 66 are illustrated using dashed lines 86. In accordance with yet alternative embodiments, high-k dielectric layers 66 are etched, and the etching rate of high-k dielectric layer 66 is lower than the etching rate of gate electrodes 78. Accordingly, the top surfaces of the recessed high-k dielectric layer 66 may be at any level lower than the top surfaces of ILD 60 and CESL 58, and higher than the top surfaces of gate electrodes 78.

Depending on the etching process condition and the etching chemical (such as the percentages of etching gases), the top surfaces of gate stacks may have different profiles, wherein some examples of the profiles may be shown by dashed lines 88. For example, dashed line 88A represents a convex top surface of gate stack 80, wherein the middle portion of the top surface of a gate stack 80 is highest, and toward the edges of gate stack 80, the height of the top surface of gate stack 80 is gradually lowered. Dashed line 88B represents a wavy top surface in which certain layers of stacked layers 70, 72, and 74 are etched more or less than other layers. For example, work function layer 72 may be etched more (or less) than layers 70 and 74. Dashed line 88C represents a concave top surface of gate stack 80, wherein a middle portion of the top surface of a gate stack 80 is lowest, and toward the edges of the gate stack 80, the height of the top surface of a gate stack 80 is gradually and increasingly higher. It is also noted that the edge portions of gate stack 80 may also be etched less due to the shading effect, wherein the tall walls of gate spacers 46 (and/or CESL 58) on the opposing sides of gate stack 80 shade the edge portions more than the middle portion of gate stack 80, so that the middle portion of gate stack 80 is etched faster than the edge portions, resulting in the concave top surface.

Figure 11:
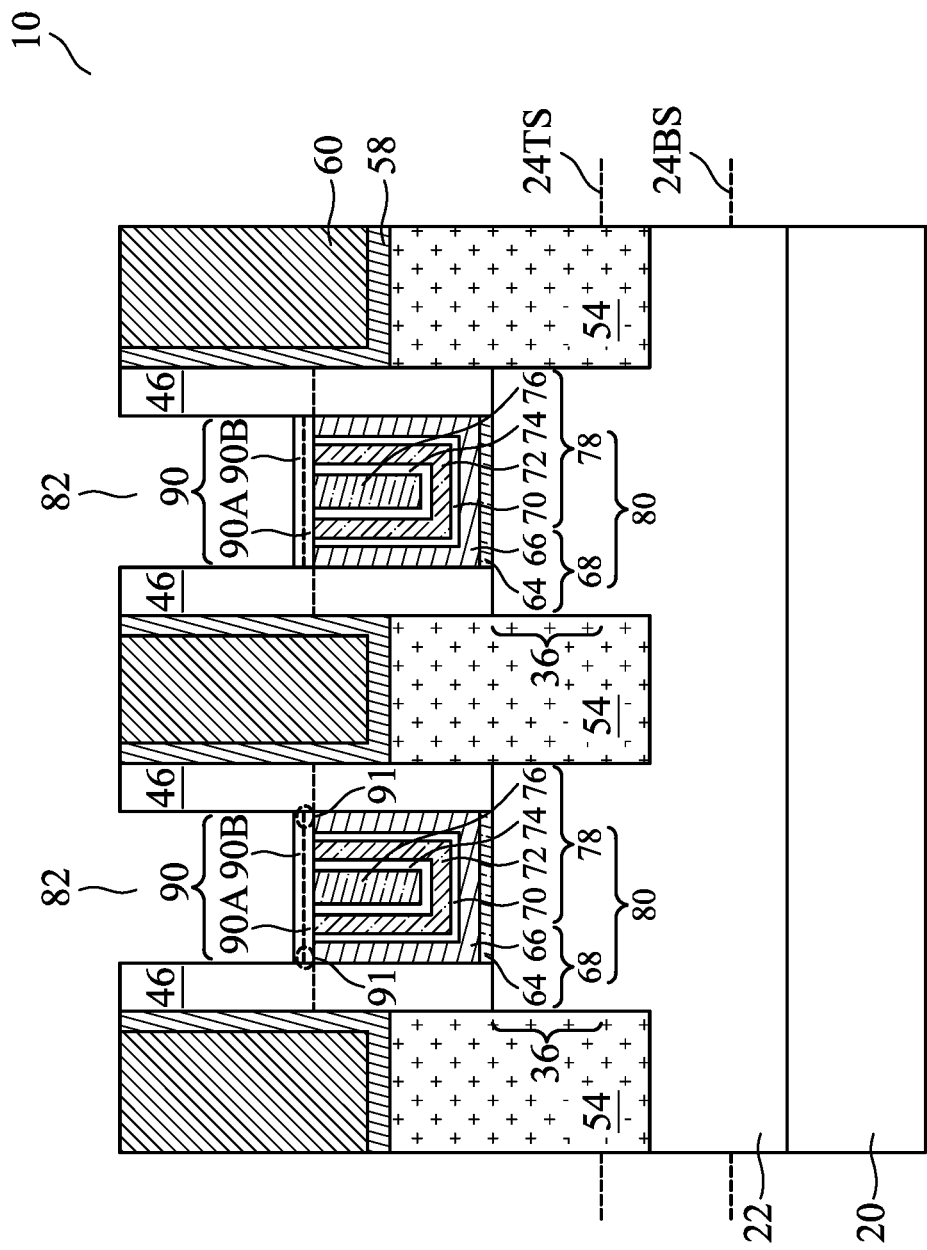

Referring to FIG. 11, conductive capping layers 90 are formed on top of gate stacks 80. The respective process is illustrated as process 222 in the process flow 200 as shown in FIG. 16. In accordance with some embodiments, conductive capping layers 90 are formed of a material that is more resistance to the etching chemicals that are used in the subsequent formation of gate contact plugs. For example, in the formation of gate contact plugs 116 (FIG. 14A), gate hard masks 92 are etched to form gate contact openings, and during the etching process, conductive capping layers 90 may protect gate stacks 80 from being damaged by the etching chemicals. Also, conductive capping layers 90 may have a high conductivity, which may be equal to or higher than the conductivity values of at least some, or all of, the layers in gate electrodes 78. In accordance with some embodiments, conductive capping layers 90 are formed through a selective deposition process such as CVD, electroless plating, or the like. For example, when tungsten is deposited as conductive capping layers 90 using CVD, process gases such as $WF_6$, $WCl_2$, $WCl_5$, $WCl_6$, $SiH_4$, $GeH_4$, $H_2$, or the like, or the combinations thereof may be used for depositing tungsten.

In accordance with some embodiments, for example, when selective plating is used to form conductive capping layers 90, conductive capping layers 90 may not grow directly from the exposed top surface of high-k dielectric layer 66, and voids (air gaps) 91 may be formed directly over the exposed top surface of high-k dielectric layer 66.

In accordance with some embodiments, conductive capping layers 90 are formed of or comprise tungsten (W), WC, Ti, TiN, TaN, Sc, Y, Er, La, Hf, Al, Ti, Pt, Pd, Ni, Co, Ru, Au, or the like, alloys thereof, or multilayers thereof. In accordance with some embodiments, each of conductive capping layers 90 is a single layer formed of a homogeneous conductive material. In accordance with alternative embodiments, each of conductive capping layers 90 is a composite layer comprising two or more sub layers formed of different materials. For example, FIG. 11 illustrates an example in which each of conductive capping layers 90 includes lower layer 90A and upper layer 90B, which are formed of different materials having different properties. In accordance with some embodiments, the lower layer 90A may have a higher conductivity value than upper layer 90B, and/or upper layer 90B may have a better resistance to the etching (as discussed above) than the lower layer 90A. For example, the lower layer 90A may be formed of or comprise Al, Ti, TiN, TaN, or the like, and the upper layer 90B may be formed of or comprise W, WC, Pt, or the like. With the bottom layer 90A having higher conductivity value, the gate resistance (including contact resistance) is reduced more. With the upper layer 90B having better resistance to etching, it provides better protection to the underlying layers from being damaged in subsequent processes.

In accordance with some embodiments, both of p-type FinFETs and n-type FinFETs are formed in a same device die and on the same semiconductor substrate. The p-type FinFETs and n-type FinFETs are also formed in accordance with some embodiments of the present disclosure. Each of the p-type FinFETs and n-type FinFETs may have the structure in any of FIGS. 14A through 14E. As aforementioned, the gate stacks 80 of the p-type FinFETs may be different from the gate stacks 80 of the n-type FinFETs. For example, the work function layers 72 of the p-type FinFETs and n-type FinFETs are formed of different materials. The work function layers 72 of the n-type FinFETs may have lower work functions than the work function layers 72 of the p-type FinFETs. In accordance with some embodiments, the conductive capping layers 90 of the p-type FinFETs and n-type FinFETs are formed of a same material, which may be formed in a same formation process, or may be formed in different formation processes. In accordance with alternative embodiments, the conductive capping layers 90 of the p-type FinFETs and n-type FinFETs are formed of different materials through separate formation processes. For example, the conductive capping layers 90 of the p-type FinFETs may be formed of a material having a higher work function (which may be a p-type work function greater than about 4.9 eV), while the conductive capping layers 90 of the n-type FinFETs may be formed of a material having a lower work function (which may be an n-type work function lower than about 4.5 eV). For example, the conductive capping layers 90 of the p-type FinFETs may be formed of or comprise high-work-function materials such as Pt, Pd, Ni, Au, or the like, or alloys thereof, and the conductive capping layers 90 of the n-type FinFETs may be formed of or comprise low-work-function materials such as W, La, Hf, Al, Ti, or the like, or alloys thereof. In accordance with alternative embodiments in which the conductive capping layers 90 of the n-type FinFETs and p-type FinFETs are multilayers, the lower layer 90A of the n-type FinFETs and p-type FinFETs are formed of different materials through separate deposition processes. For example, the lower layer 90A of the n-type FinFETs may be formed of a low-work-function material as aforementioned, and the lower layer 90A of the p-type FinFETs may be formed of a high-work-function material as aforementioned. The upper layers 90B of the n-type FinFETs and p-type FinFETs, on the other hand, may be formed of the same material that is more resistant to etching than the underlying lower layer 90A, for example, through a common deposition process.

Figure 12A:
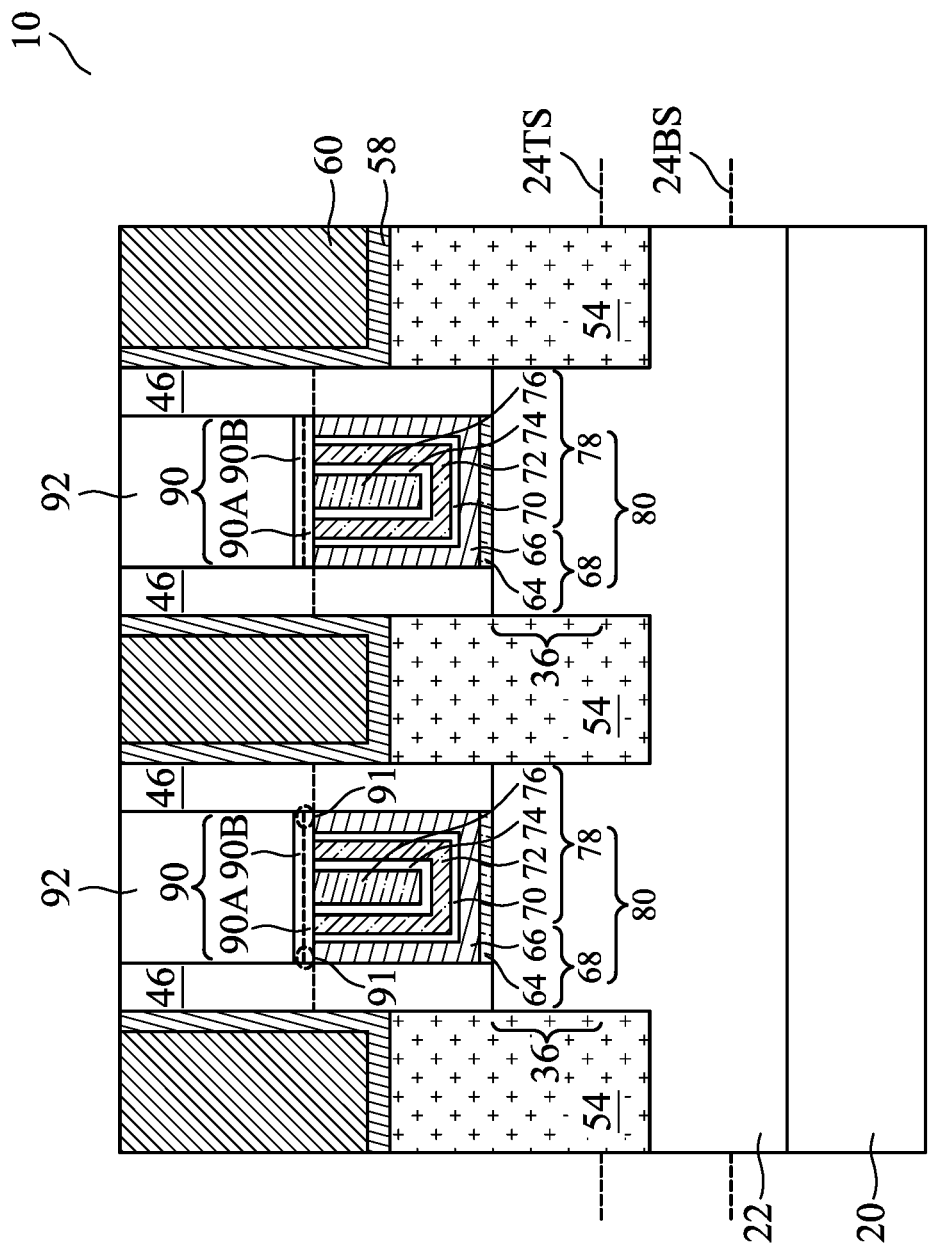
Figure 12B:
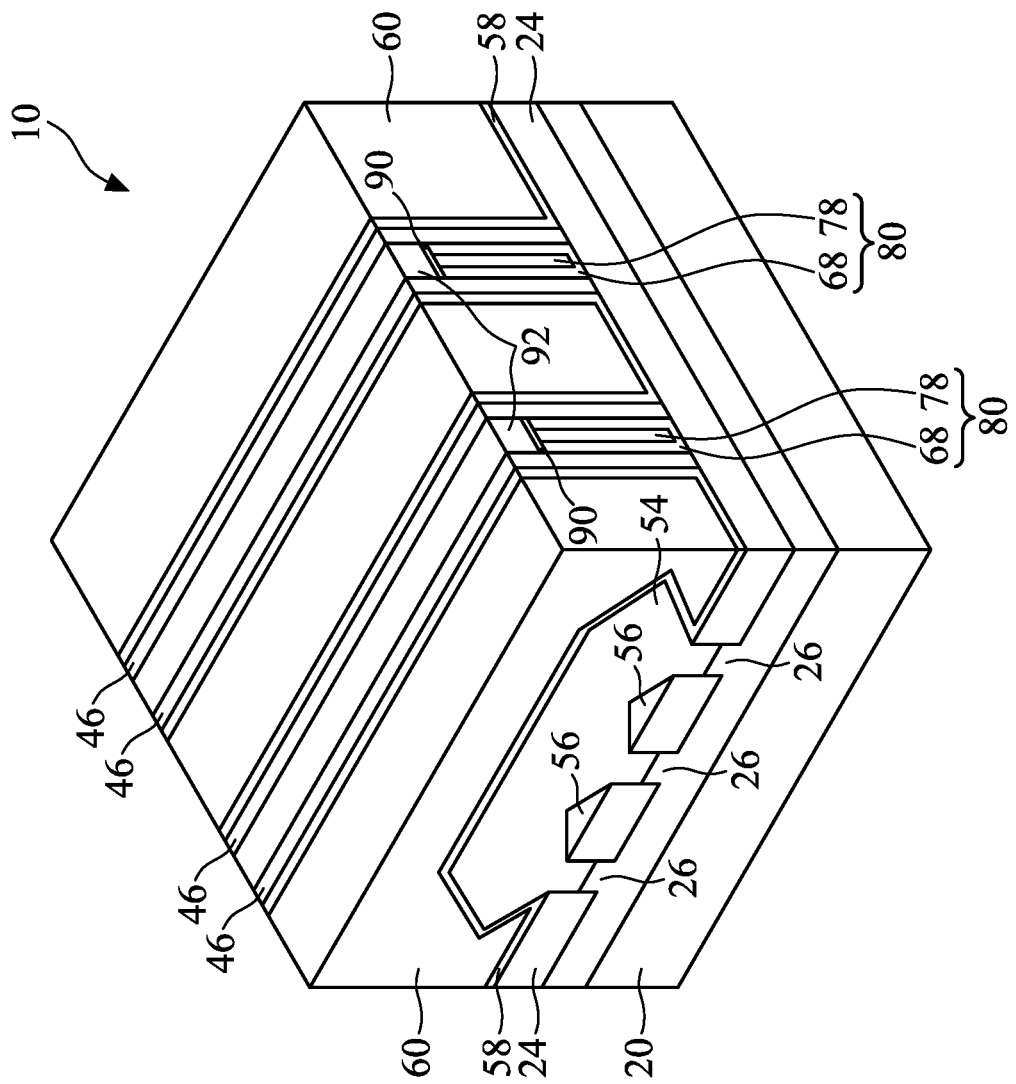

In a subsequent process, as shown in FIGS. 12A and 12B, hard masks 92 are formed over conductive capping layers 90. The respective process is illustrated as process 224 in the process flow 200 as shown in FIG. 16. FIGS. 12A and 12B illustrate a cross-sectional view and a perspective view, respectively. In accordance with some embodiments of the present disclosure, the formation of hard masks 92 includes a deposition process to form a blanket dielectric material, and a planarization process to remove the excess dielectric material over gate spacers 46 and ILD 60. Hard masks 92 may be formed of silicon nitride, silicon oxynitride, silicon carbo-nitride, for example, or other like dielectric materials.

Figure 13A:
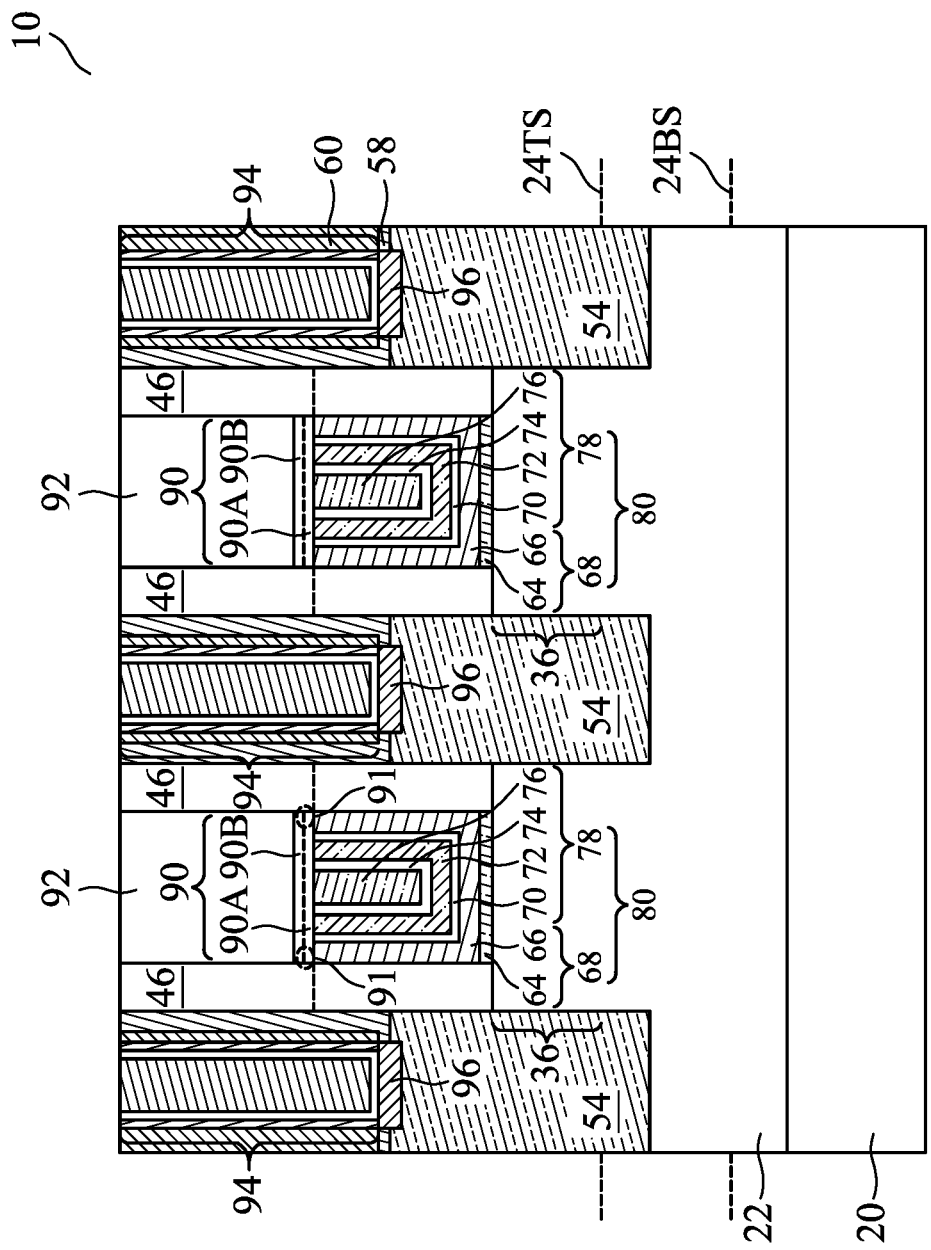
Figure 13B:
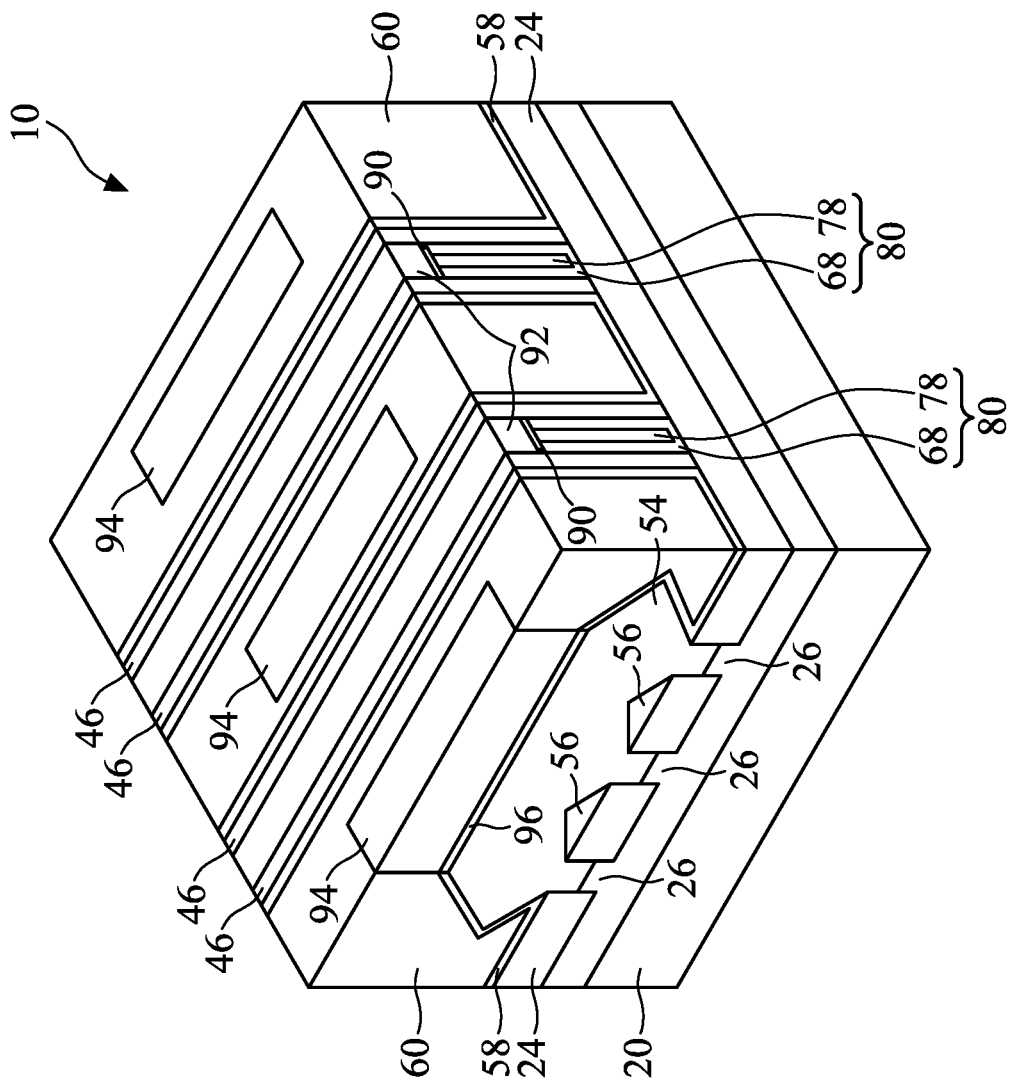

FIGS. 13A and 13B illustrate the formation of lower source/drain contact plugs 94 and silicide regions 96. The respective process is illustrated as process 226 in the process flow 200 as shown in FIG. 16. In accordance with some embodiments of the present disclosure, the formation process include etching ILD 60 and CESL 58 to form source/drain contact openings, depositing a metal layer (such as a titanium layer, a cobalt layer, or the like) extending into the source/drain contact openings, depositing a barrier layer (such as a titanium nitride layer), and performing an annealing process, so that the bottom portions of the metal layer reacts with source/drain region 54 to form silicide regions 96. The barrier layer and the remaining sidewall portions of the metal layer may be removed or left un-removed. When the barrier layer is removed, another barrier layer such as a titanium nitride layer may be deposited. The remaining unfilled source/drain contact openings may be filled with a metallic material such as cobalt, tungsten, other applicable metals, or the alloys thereof. A planarization process such as a CMP process or a mechanical grinding process is performed to remove excess materials to form contact plugs 94.

Figure 14A:
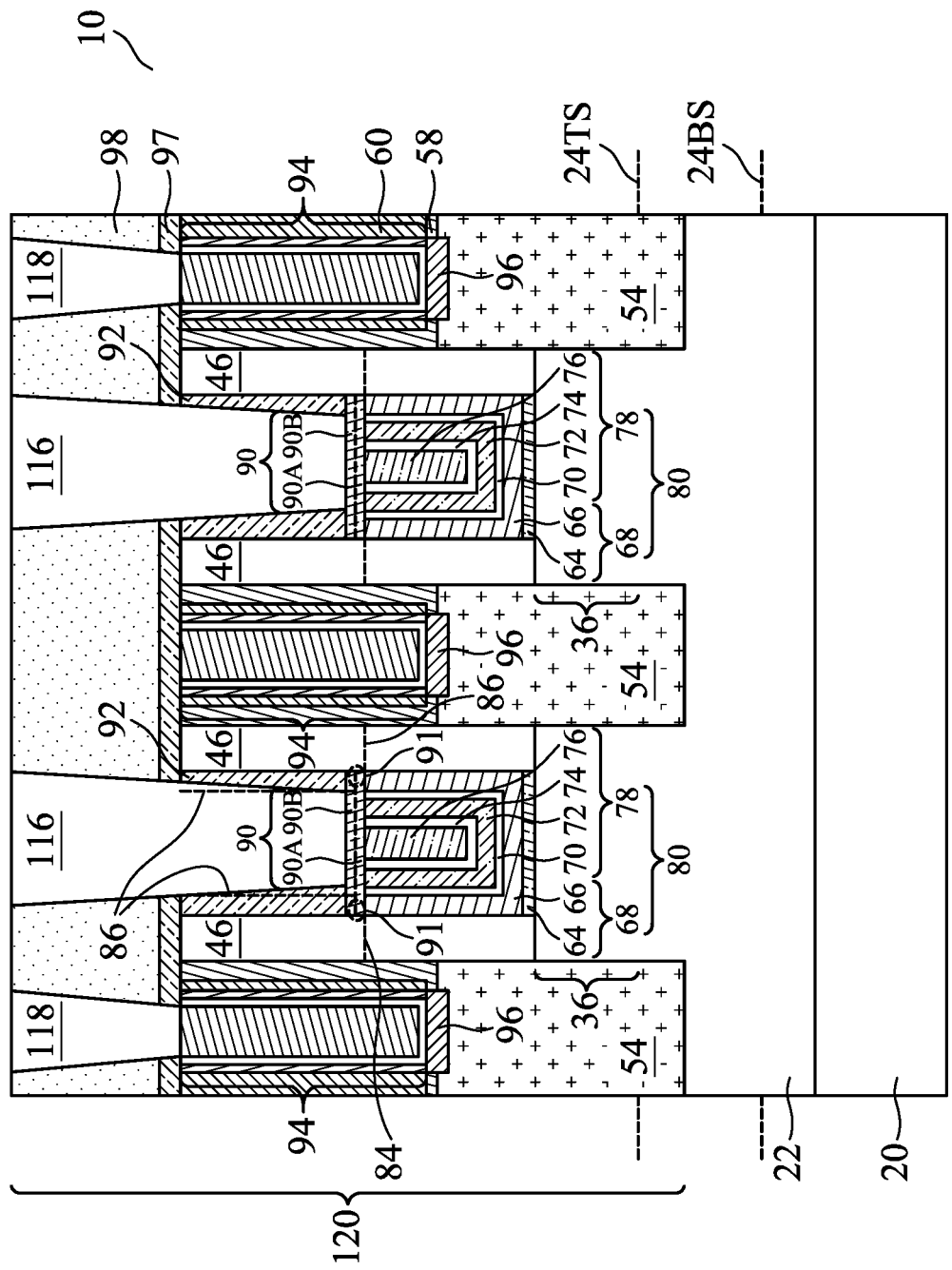
Figure 14B:
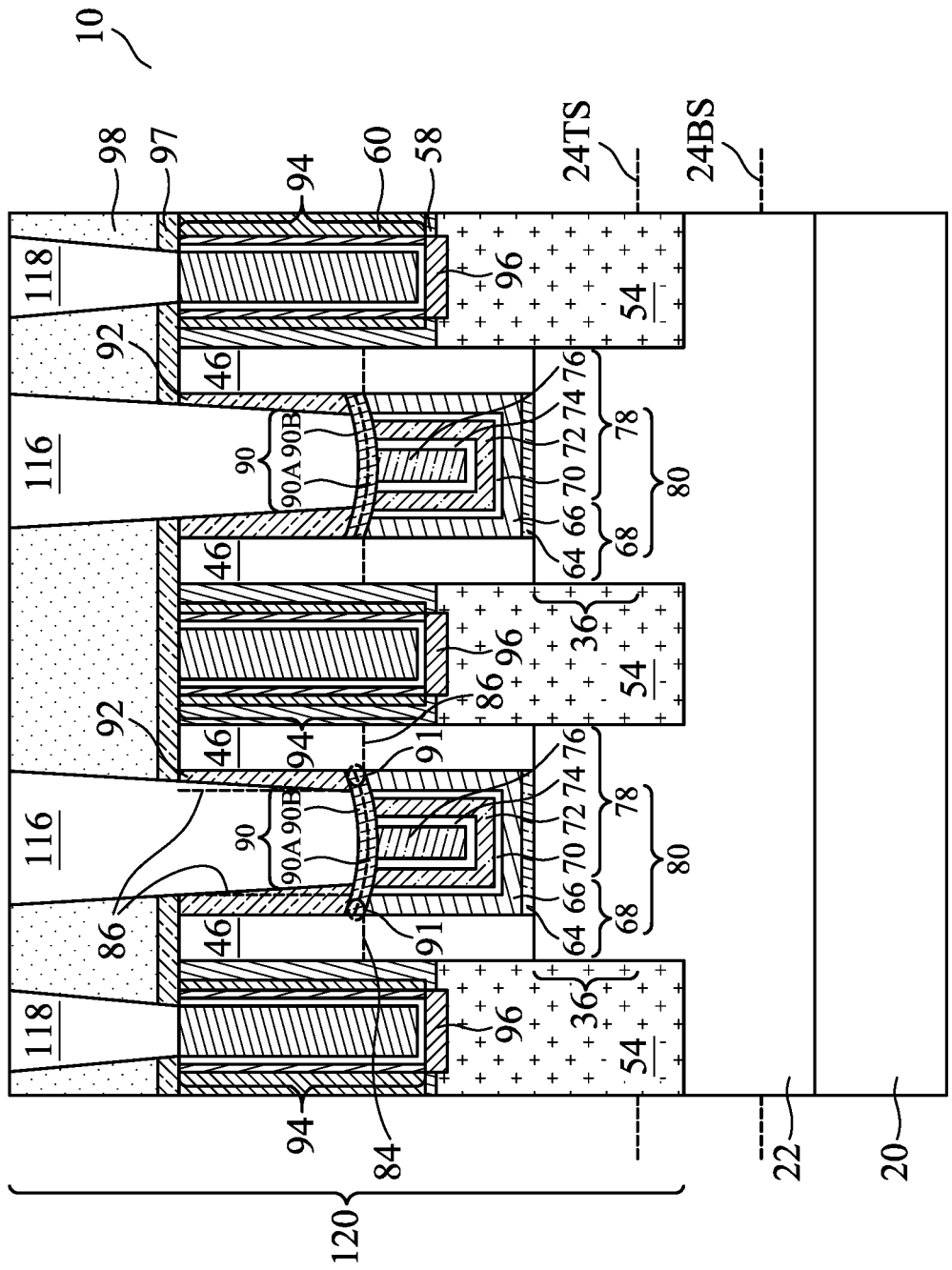
FIGS. 14B, 14C, 14D, and 14E illustrate the metal gates having conductive capping layers in accordance with some embodiments.
Figure 15:
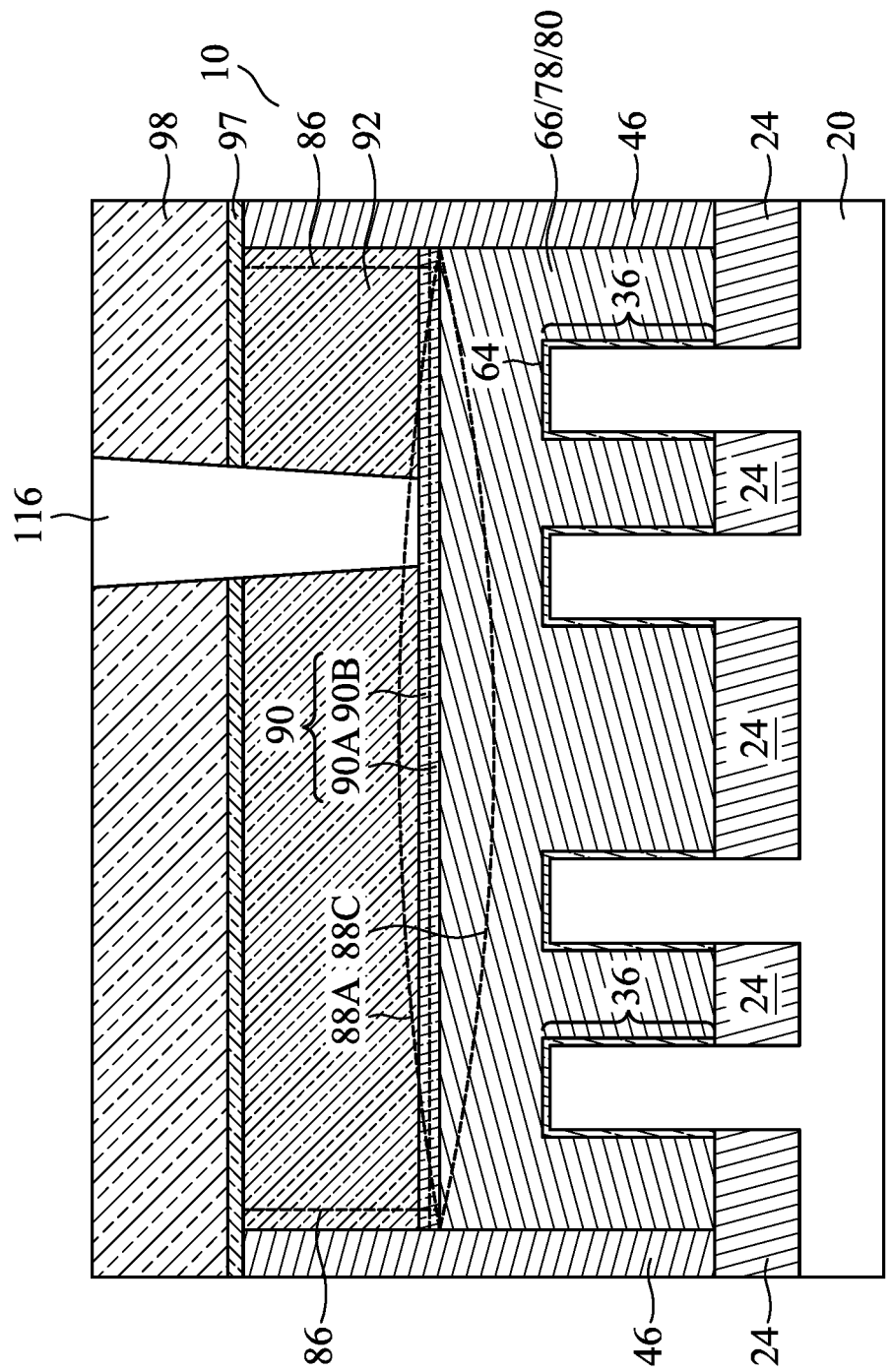
FIG. 15 illustrates the cross-sectional view of a metal gate in a plane parallel to a gate-length direction in accordance with some embodiments.

FIG. 14A illustrates the formation of Etch Stop Layer (ESL) 97 and dielectric layer 98 (which may also be an ILD) over ESL 97. FIG. 15 illustrates the cross-sectional view in a plane parallel to a gate-length direction with correspondence to what is illustrated in FIG. 14A. The respective process is illustrated as process 228 in the process flow 200 as shown in FIG. 16. ESL 97 may be formed of or comprise silicon nitride, silicon carbon nitride, silicon carbon oxide, carbon nitride, aluminum oxide, aluminum nitride, the like, or multilayers thereof. Dielectric layer 98 may be formed of or comprise silicon dioxide, a low-k dielectric material, silicon oxynitride, PSG, BSG, BPSG, USG, FSG, OSG, SiOC, a spin-on glass, a spin-on polymer, or the like. ESL 97 and dielectric layer 98 may be deposited by using spin-on coating, CVD, ALD, LPCVD, Plasma Enhance Chemical Vapor Deposition (PECVD) or the like.

Gate contact plugs 116 and upper source/drain contact plugs 118 are then formed. The respective process is illustrated as process 230 in the process flow 200 as shown in FIG. 16. The formation process may include etching dielectric layer 98 and ESL 97 to form openings, until conductive capping layer 90 and source/drain contact plugs 94 are revealed, filling a conductive layer(s) to fill the openings, and performing a planarization process to removed excess portions of the conductive layers. The etching process may be anisotropic. For example, depending on the material of hard masks 92, the etching gases may include HF, $NH_3$, fluorine-containing gas such as the mixture of $CF_4$, $O_2$, and $N_2$, the mixture of $NF_3$ and $O_2$, $SF_6$, the mixture of $SF_6$ and $O_2$, or $BCl_3$, $Cl_2$, $CF_4$, $CH_4$, $CHF_3$, $CxHyFz$ (with x=1~6, y=0~9, and Z=0~12), $NF_3$, HBr, CO, $CO_2$, COS, $SO_2$, $SF_6$, $TiCl_x$, $TaCl_x$, $WCl_x$, $O_2$, Ar, and/or the like. In the formation of the openings, the etching gases may be selected to have a low etching rate on conductive capping layers 90, so that conductive capping layers 90 are not etched. In accordance with some embodiments, the etching gases have the ability to etch gate electrodes 78 if gate electrodes 78 are exposed to the etching gases. Alternatively stated, the etching rate of gate electrodes 78 (if exposed to the etching gas) would be higher than the etching rate of conductive capping layers 90. Furthermore, in accordance with some embodiments in which conductive capping layers 90 are multilayers, the etching rate of the lower sub layers in conductive capping layers 90 would be higher than the etching rate of the upper sub layers in conductive capping layers 90. In accordance with some embodiments of the present disclosure, due to the protection of conductive capping layers 90, however, gate electrodes 78 are protected from being damaged. FinFET 120 is thus formed.

Figure 14C:
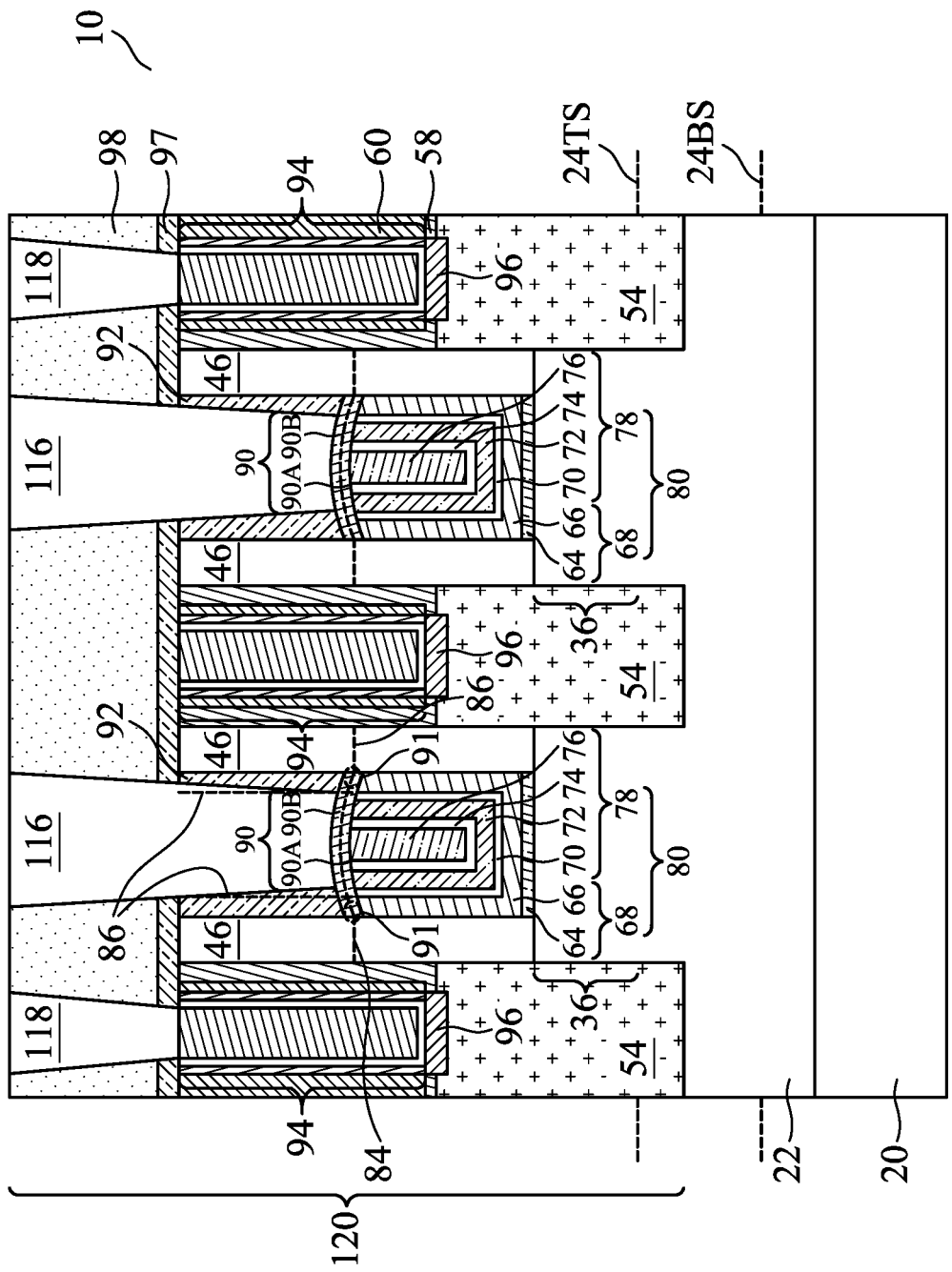
Figure 14D:
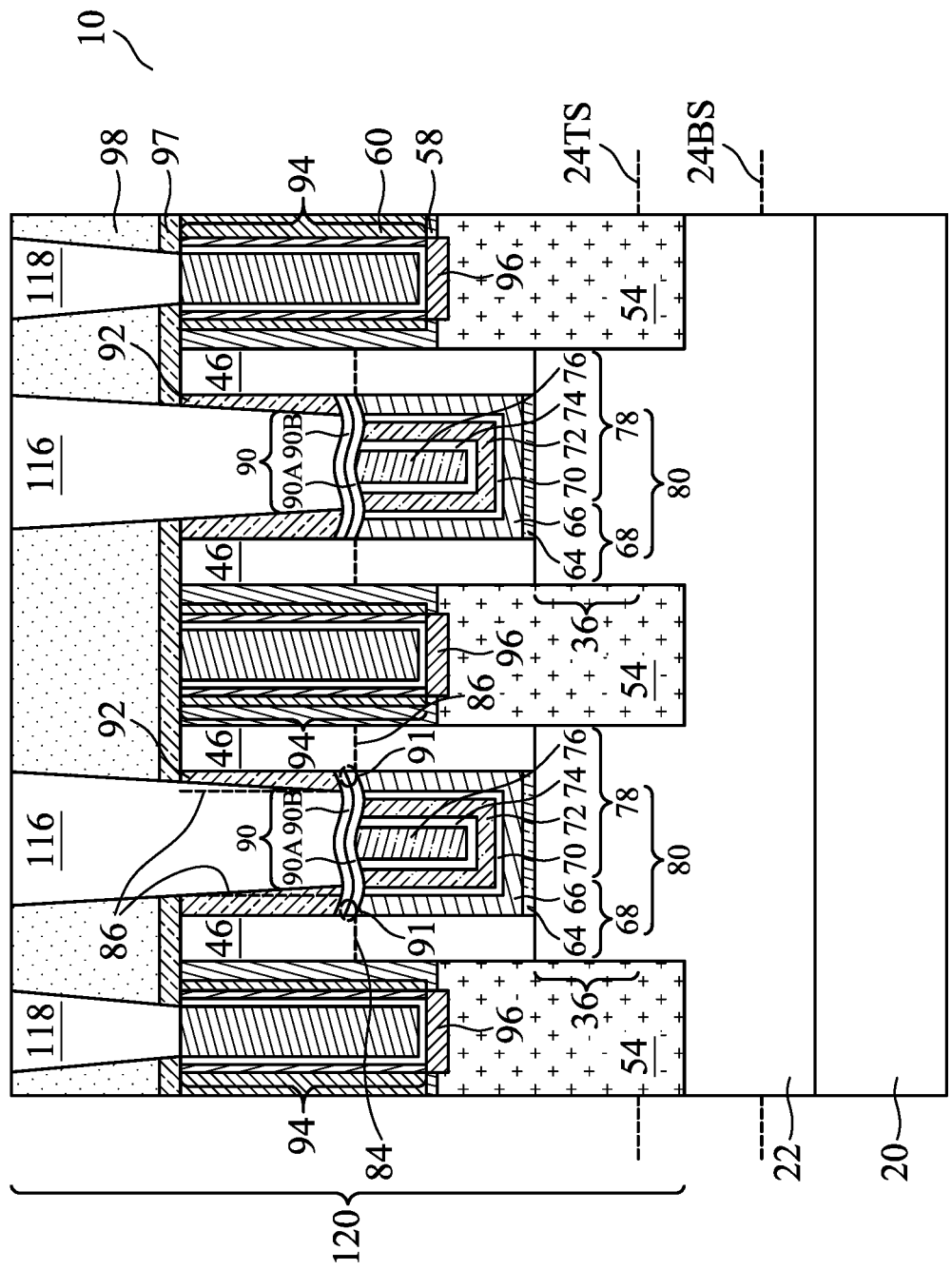
Figure 14E:
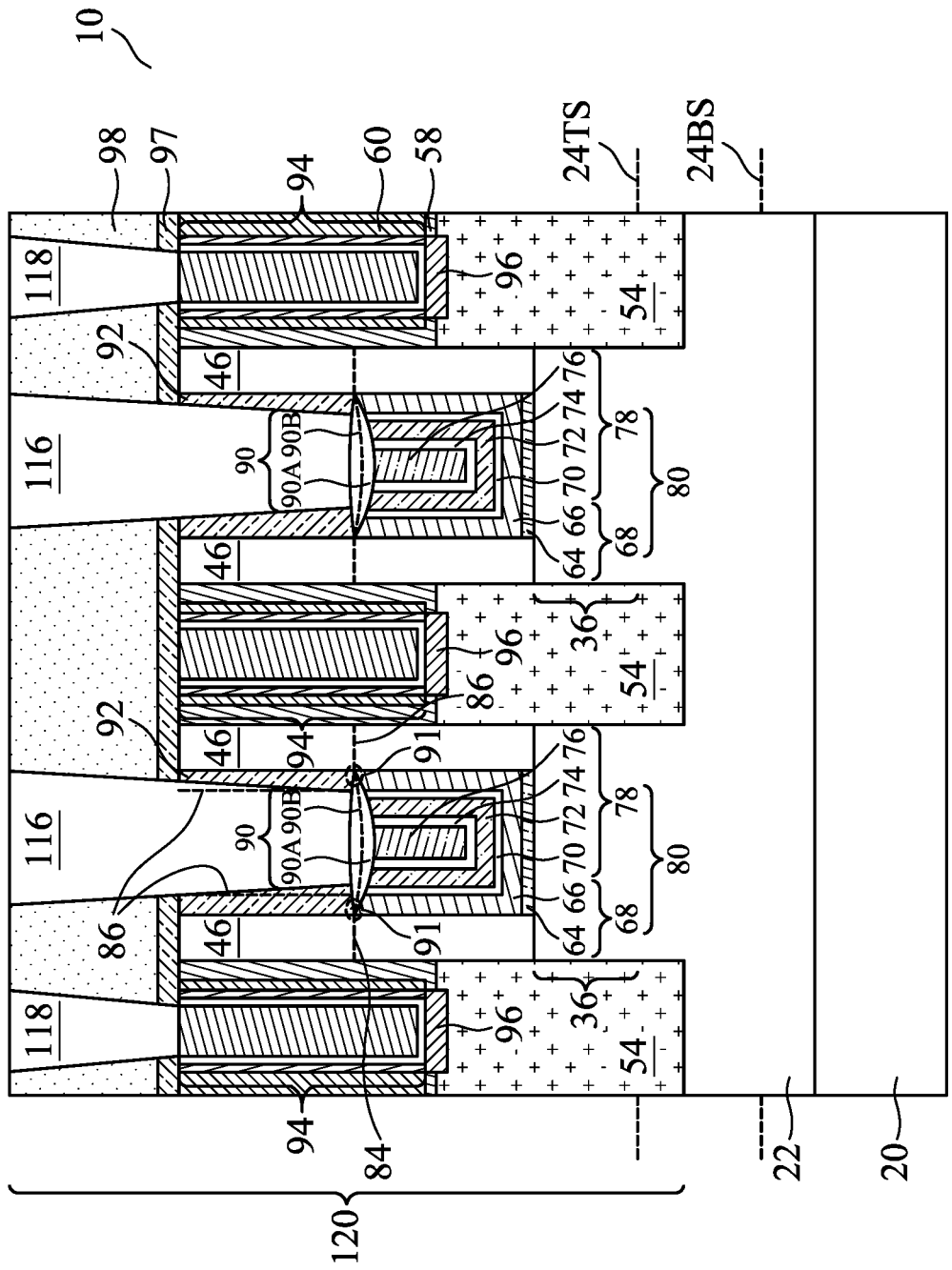

FIG. 14A illustrates an embodiment in which conductive capping layers 90 are planar, and are conformal and having a uniform thickness (within process variation). FIGS. 14B, 14C, 14D, and 14E illustrate conductive capping layers 90 having different profiles. For example, in FIG. 14B, the top surfaces of gate stacks 80 have a concave profile. In FIG. 14C, the top surfaces of gate stacks 80 have a convex profile. In FIG. 14D, the top surfaces of gate stacks 80 have a wavy profile. For example, the lowest point (or highest point) of the top surface of a gate stack 80 may be a point of the top surface of work function layer 72. In FIG. 14E, conductive capping layers 90 have a non-uniform thickness. Although FIG. 14E illustrates that the middle portion of conductive capping layers 90 is thicker than edge portions, the middle portion of conductive capping layers 90 may also be thinner than edge portions. It is appreciated that the multiple features and profiles in FIGS. 14A, 14B, 14C, 14D, and 14E may co-exist in the same structure when applicable. For example, voids 91 may be, or may not be, formed in each of these structures. Also, the conductive capping layers 90 with non-uniform thickness, as shown in FIG. 14E, may be combined with the concave, convex, or wavy top surfaces of gate stacks 80.

The embodiments of the present disclosure have some advantageous features. By forming conductive capping layers with better resistance to etching, the damage to gate stacks in the formation of gate contact plugs is prevented. Also, the contact resistance may be reduced by forming conductive capping layers adopting a material(s) having a high conductivity.

In accordance with some embodiments of the present disclosure, a method comprises removing a dummy gate stack to form a first trench between first gate spacers; forming a first replacement gate stack in the first trench; recessing the first replacement gate stack to form a second trench between the first gate spacers; selectively depositing a first conductive capping layer in the second trench; forming a dielectric hard mask in the second trench and over the first conductive capping layer; etching the dielectric hard mask using an etching gas to form an opening in the dielectric hard mask, wherein the first replacement gate stack is revealed to the opening; and forming a gate contact plug over and contacting the first conductive capping layer. In an embodiment, in the etching, a gate dielectric in the first replacement gate stack is recessed, and sidewalls of the first gate spacers are exposed to the second trench. In an embodiment, the depositing the first conductive capping layer comprises depositing a first sub layer on the first replacement gate stack; and depositing a second sub layer over the first sub layer, wherein the first sub layer has a higher conductivity value than the second sub layer. In an embodiment, the method further comprises recessing a second replacement gate stack to form a third trench between second gate spacers; and selectively depositing a second conductive capping layer in the third trench and over the second replacement gate stack, wherein the second conductive capping layer comprises a different material than the first conductive capping layer. In an embodiment, the first replacement gate stack is comprised in a p-type transistor, and the second replacement gate stack is comprised in an n-type transistor, and the first conductive capping layer has a higher work function than the second conductive capping layer. In an embodiment, the first conductive capping layer is more resistant to the etching gas than the first replacement gate stack. In an embodiment, after the recessing, the first replacement gate stack has a convex top surface or a concave top surface. In an embodiment, the first conductive capping layer is selectively deposited through chemical vapor deposition. In an embodiment, the first conductive capping layer is selectively deposited through plating.

In accordance with some embodiments of the present disclosure, a device comprises a semiconductor region; gate spacers on the semiconductor region; a gate stack over the semiconductor region and between the gate spacers, wherein the gate stack comprises a plurality of layers; a conductive capping layer over and contacting the plurality of layers of the gate stack; a dielectric hard mask over the conductive capping layer and between the gate spacers; and a gate contact plug penetrating through the dielectric hard mask to land on the conductive capping layer. In an embodiment, the gate stack comprises a gate dielectric and a gate electrode, with the gate dielectric extending underlying and on sidewalls of the gate electrode, wherein the conductive capping layer comprises a portion overlapping the gate dielectric. In an embodiment, the conductive capping layer is separated from the gate dielectric by an air gap. In an embodiment, the conductive capping layer comprises tungsten. In an embodiment, the conductive capping layer comprises a first sub layer contacting the gate stack; and a second sub layer over the first sub layer, wherein the first sub layer has a higher conductivity value than the second sub layer. In an embodiment, the gate stack comprises a concave top surface. In an embodiment, the gate stack comprises a convex top surface.

In accordance with some embodiments of the present disclosure, a device comprises a source region and a drain region; a gate stack between the source region and the drain region, wherein the gate stack comprises a plurality of layers, and each of the layers has a basin shape with a bottom portion and sidewall portions over and joined to the bottom portion; gate spacers on opposite sidewalls of the gate stack; and a conductive layer over and contacting top surfaces of the sidewall portions of the plurality of layers. In an embodiment, the conductive layer is between the gate spacers. In an embodiment, the conductive layer comprises a plurality of sub layers comprising different materials. In an embodiment, the plurality of sub layers of the conductive layer comprises a first sub layer and a second sub layer, with the first sub layer having a higher conductivity value than the second sub layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   removing a dummy gate stack to form a first trench between first gate spacers;
   forming a first replacement gate stack in the first trench;

recessing the first replacement gate stack to form a second trench between the first gate spacers;

selectively depositing a first conductive capping layer in the second trench, wherein the first conductive capping layer is electrically conductive;

forming a dielectric hard mask in the second trench and over the first conductive capping layer;

etching the dielectric hard mask using an etching gas to form an opening in the dielectric hard mask, wherein the first replacement gate stack is revealed to the opening; and forming a gate contact plug over and contacting the first conductive capping layer.

2. The method of claim 1, wherein in the etching, a gate dielectric in the first replacement gate stack is recessed, and sidewalls of the first gate spacers are exposed to the second trench.

3. The method of claim 1, wherein the depositing the first conductive capping layer comprises:

depositing a first sub layer on the first replacement gate stack; and depositing a second sub layer over the first sub layer, wherein the first sub layer has a higher conductivity value than the second sub layer.

4. The method of claim 1 further comprising:

recessing a second replacement gate stack to form a third trench between second gate spacers; and selectively depositing a second conductive capping layer in the third trench and over the second replacement gate stack, wherein the second conductive capping layer comprises a different material than the first conductive capping layer.

5. The method of claim 4, wherein the first replacement gate stack is comprised in a p-type transistor, and the second replacement gate stack is comprised in an n-type transistor, and the first conductive capping layer has a higher work function than the second conductive capping layer.

6. The method of claim 1, wherein the first conductive capping layer is more resistant to the etching gas than the first replacement gate stack.

7. The method of claim 1, wherein after the recessing, the first replacement gate stack has a convex top surface or a concave top surface.

8. The method of claim 1, wherein the first conductive capping layer is selectively deposited through chemical vapor deposition.

9. The method of claim 1, wherein the first conductive capping layer is selectively deposited through plating.

10. A device comprising:

a semiconductor region;

gate spacers on the semiconductor region;

a gate stack over the semiconductor region and between the gate spacers, wherein the gate stack comprises a plurality of layers;

a conductive capping layer over and contacting the plurality of layers of the gate stack, wherein the conductive capping layer is electrically conductive;

a dielectric hard mask over the conductive capping layer and between the gate spacers; and a gate contact plug penetrating through the dielectric hard mask to land on the conductive capping layer.

11. The device of claim 10 further comprising a contact etch stop layer and an inter-layer dielectric over the contact etch stop layer, wherein the gate stack is in the contact etch stop layer and the inter-layer dielectric, and wherein an entirety of the conductive capping layer is lower than top surfaces of the contact etch stop layer and the inter-layer dielectric.

12. The device of claim 10, wherein the gate stack comprises a gate dielectric and a gate electrode, with the gate dielectric extending underlying and on sidewalls of the gate electrode, wherein the conductive capping layer comprises a portion overlapping the gate dielectric, and wherein the conductive capping layer is separated from the gate dielectric by an air gap.

13. The device of claim 10, wherein the conductive capping layer comprises tungsten.

14. The device of claim 10, wherein the conductive capping layer comprises:

a first sub layer contacting the gate stack; and a second sub layer over the first sub layer, wherein both of the first sub layer and the second sub layer are electrically conductive, and wherein the first sub layer has a higher electrical conductivity value than the second sub layer.

15. The device of claim 10, wherein the gate stack comprises a concave top surface.

16. The device of claim 10, wherein the gate stack comprises a convex top surface.

17. A device comprising:

an inter-layer dielectric comprising a first top surface;

a source region and a drain region lower than the inter-layer dielectric;

a gate stack between the source region and the drain region, wherein the gate stack is in the inter-layer dielectric, wherein the gate stack comprises a plurality of layers, and each of the layers has a basin shape with a bottom portion and sidewall portions over and joined to the bottom portion;

gate spacers on opposite sidewalls of the gate stack; and a conductive layer over and contacting top surfaces of the sidewall portions of the plurality of layers, wherein a second top surface of the conductive layer is lower than the first top surface of the inter-layer dielectric and top ends of the gate spacers.

18. The device of claim 17, wherein an entirety of the conductive layer is between the gate spacers, and wherein a bottom surface of the conductive layer is higher than bottom ends of the gate spacers.

19. The device of claim 17, wherein the conductive layer comprises a first sub layer comprising a first material and a second sub layer comprising a second material over and contacting the first sub layer, wherein both of the first sub layer and the second sub layer comprise opposite ends in physical contact with the gate spacers.

20. The device of claim 19 further comprising a dielectric hard mask between the gate spacers, with a third top surface of the dielectric hard mask being coplanar with the top ends of the gate spacers, and wherein a first portion of the dielectric hard mask overlaps a second portion of the conductive layer.

* * * * *